United States Patent
Hopkins et al.

(10) Patent No.: US 12,219,757 B2
(45) Date of Patent: Feb. 4, 2025

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: John D. Hopkins, Meridian, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 208 days.

(21) Appl. No.: 17/836,357

(22) Filed: Jun. 9, 2022

(65) Prior Publication Data
US 2022/0302154 A1   Sep. 22, 2022

Related U.S. Application Data

(62) Division of application No. 15/931,299, filed on May 13, 2020, now Pat. No. 11,387,243.

(51) Int. Cl.
| | |
|---|---|
| *H10B 43/27* | (2023.01) |
| *H10B 41/10* | (2023.01) |
| *H10B 41/27* | (2023.01) |
| *H10B 41/35* | (2023.01) |
| *H10B 43/10* | (2023.01) |
| *H10B 43/35* | (2023.01) |

(52) U.S. Cl.
CPC ............. *H10B 41/27* (2023.02); *H10B 41/10* (2023.02); *H10B 41/35* (2023.02); *H10B 43/10* (2023.02); *H10B 43/27* (2023.02); *H10B 43/35* (2023.02)

(58) Field of Classification Search
CPC .............................. H10B 43/27; H10B 43/20
See application file for complete search history.

(56) References Cited

U.S. PATENT DOCUMENTS

| | | | |
|---|---|---|---|
| 5,856,234 | A | 1/1999 | Chiang et al. |
| 9,711,520 | B2 | 7/2017 | Nowak et al. |
| 10,236,301 | B1 | 3/2019 | Howder et al. |
| 10,242,997 | B2 | 3/2019 | Choi et al. |
| 10,290,652 | B1 | 5/2019 | Sharangpani et al. |
| 10,388,665 | B1 | 8/2019 | Xie et al. |
| 10,446,578 | B1 | 10/2019 | Howder et al. |

(Continued)

FOREIGN PATENT DOCUMENTS

| | | |
|---|---|---|
| CN | 1917166 | 2/2007 |
| CN | 101834188 | 9/2010 |

(Continued)

*Primary Examiner* — Christopher A Johnson
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers. Channel-material-string structures of memory cells extend through the insulative tiers and the conductive tiers. The channel-material-string structures individually comprise an upper portion above and joined with a lower portion. Individual of the channel-material-string structures comprise at least one external jog surface in a vertical cross-section where the upper and lower portions join. Other embodiments, including method are disclosed.

11 Claims, 26 Drawing Sheets

(56) References Cited

U.S. PATENT DOCUMENTS

| | | |
|---|---|---|
| 11,211,390 B2 | 12/2021 | Leobandung |
| 11,251,190 B2 | 2/2022 | Hopkins et al. |
| 11,282,847 B2 | 3/2022 | Hopkins et al. |
| 11,393,835 B2 | 7/2022 | Hopkins et al. |
| 11,411,012 B2 | 8/2022 | Hopkins |
| 11,967,632 B2 | 4/2024 | Hopkins |
| 2007/0232041 A1 | 10/2007 | Choi et al. |
| 2008/0253183 A1 | 10/2008 | Mizukami et al. |
| 2010/0200908 A1 | 8/2010 | Lee et al. |
| 2011/0065270 A1* | 3/2011 | Shim ............... H10B 43/27 257/E21.613 |
| 2011/0147824 A1 | 6/2011 | Son et al. |
| 2012/0049268 A1 | 3/2012 | Chang et al. |
| 2012/0098049 A1 | 4/2012 | Moon et al. |
| 2012/0267699 A1 | 10/2012 | Kiyotoshi |
| 2013/0270625 A1 | 10/2013 | Jang et al. |
| 2014/0001530 A1* | 1/2014 | Song ............... H01L 29/7926 257/314 |
| 2014/0367762 A1 | 12/2014 | Tian et al. |
| 2015/0206900 A1 | 7/2015 | Nam et al. |
| 2015/0255481 A1 | 9/2015 | Baenninger et al. |
| 2016/0043203 A1 | 2/2016 | Alperstein et al. |
| 2016/0268263 A1 | 9/2016 | Lee et al. |
| 2016/0307908 A1 | 10/2016 | Sharangpani et al. |
| 2016/0343730 A1 | 11/2016 | Son et al. |
| 2017/0117289 A1 | 4/2017 | Liu et al. |
| 2017/0125430 A1 | 5/2017 | Nishikawa et al. |
| 2017/0148800 A1 | 5/2017 | Nishikawa et al. |
| 2017/0162594 A1 | 6/2017 | Ahn |
| 2017/0207226 A1 | 7/2017 | Lee |
| 2017/0221921 A1 | 8/2017 | Kanamori et al. |
| 2017/0263626 A1 | 9/2017 | Okamoto et al. |
| 2017/0263627 A1 | 9/2017 | Furuhashi et al. |
| 2017/0271261 A1* | 9/2017 | Tsutsumi ............ H10B 43/10 |
| 2017/0278859 A1 | 9/2017 | Sharangpani et al. |
| 2017/0301684 A1 | 10/2017 | Park et al. |
| 2017/0345843 A1* | 11/2017 | Lee ................ H10B 43/40 |
| 2018/0006049 A1* | 1/2018 | Inomata ............ H01L 23/5283 |
| 2018/0026050 A1 | 1/2018 | Lee et al. |
| 2018/0068707 A1 | 3/2018 | Shin et al. |
| 2018/0122906 A1 | 5/2018 | Yu et al. |
| 2018/0294270 A1 | 10/2018 | Lee et al. |
| 2018/0366486 A1 | 12/2018 | Hada et al. |
| 2019/0043830 A1 | 2/2019 | Sakakibara et al. |
| 2019/0115362 A1 | 4/2019 | Chi |
| 2019/0148399 A1 | 5/2019 | Jung et al. |
| 2019/0311907 A1 | 10/2019 | Lai et al. |
| 2019/0319041 A1 | 10/2019 | Kwak et al. |
| 2019/0348433 A1 | 11/2019 | Choi |
| 2019/0378856 A1 | 12/2019 | Park et al. |
| 2020/0058672 A1 | 2/2020 | Nishikawa et al. |
| 2020/0127004 A1 | 4/2020 | Dorhout et al. |
| 2020/0312873 A1 | 10/2020 | Xiao |
| 2021/0125920 A1 | 4/2021 | Hu et al. |
| 2021/0257265 A1* | 8/2021 | Kim ............... H10B 63/845 |
| 2021/0280691 A1 | 9/2021 | Hopkins |

FOREIGN PATENT DOCUMENTS

| | | |
|---|---|---|
| CN | 102122661 | 7/2011 |
| CN | 102959693 | 3/2013 |
| CN | 104425511 | 3/2015 |
| CN | 105810683 | 7/2016 |
| CN | 105977257 | 9/2016 |
| CN | 106298679 | 1/2017 |
| CN | 106856198 | 6/2017 |
| CN | 107046037 | 8/2017 |
| CN | 107305893 | 10/2017 |
| CN | 107431071 | 12/2017 |
| CN | 107799529 | 3/2018 |
| CN | 108055874 | 5/2018 |
| CN | 108431961 | 8/2018 |
| CN | 108695338 | 10/2018 |
| CN | 108807405 | 11/2018 |
| CN | 109300907 | 2/2019 |
| CN | 109659308 | 4/2019 |
| CN | 110034119 | 7/2019 |
| CN | 110391238 | 10/2019 |
| CN | 110556382 | 12/2019 |
| CN | 110571223 | 12/2019 |
| CN | 110581137 | 12/2019 |
| CN | 110785851 | 2/2020 |
| CN | 110858594 | 3/2020 |
| CN | 110896671 | 3/2020 |
| CN | 111063688 | 4/2020 |
| CN | 111223872 | 6/2020 |
| CN | 111448661 | 7/2020 |
| CN | 112713151 | 4/2021 |
| JP | 2007-281470 | 10/2007 |
| JP | 2008171838 | 7/2008 |
| JP | 2017-168527 | 9/2017 |
| WO | WO 2012/003301 | 1/2012 |
| WO | WO 2021/142980 | 7/2021 |

\* cited by examiner

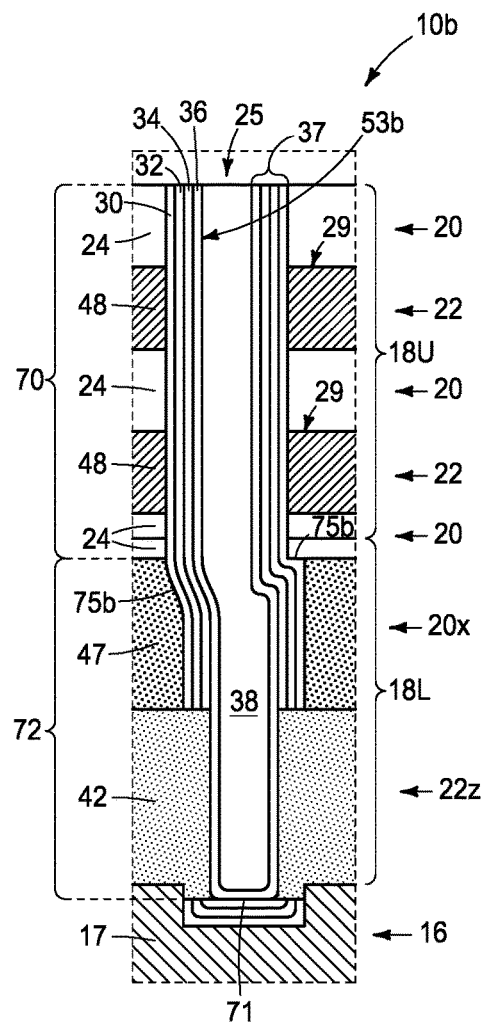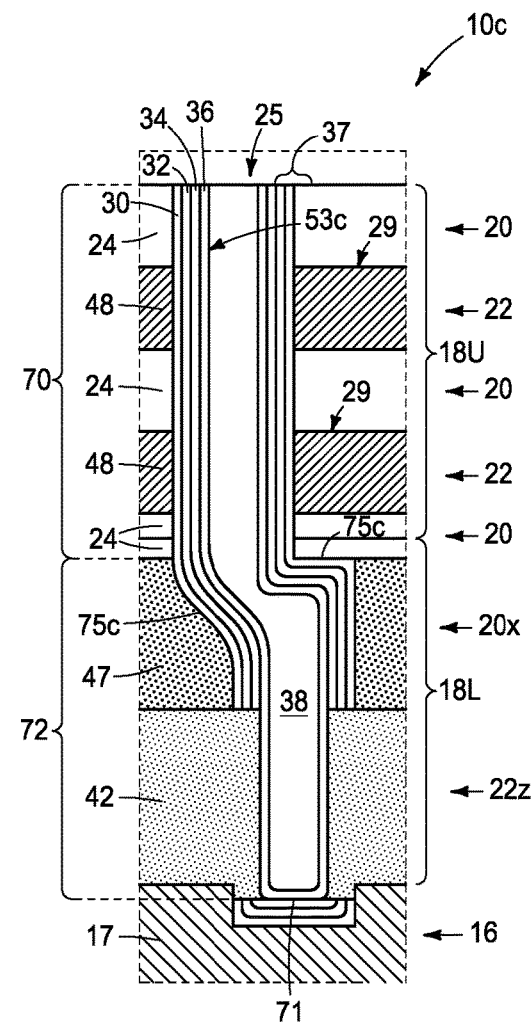
FIG. 40   FIG. 41

MEMORY ARRAYS COMPRISING STRINGS OF MEMORY CELLS AND METHODS USED IN FORMING A MEMORY ARRAY COMPRISING STRINGS OF MEMORY CELLS

RELATED PATENT DATA

This patent resulted from a divisional application of U.S. patent application Ser. No. 15/931,299, filed May 13, 2020, entitled "Memory Arrays Comprising Strings Of Memory Cells And Methods Used In Forming A Memory Array Comprising Strings Of Memory Cells", naming John D. Hopkins and Nancy M. Lomeli as inventors, the disclosure of which is incorporated by reference.

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 11-13 and 39-53 are diagrammatic cross-sectional views of portions of substrates in process in accordance with some embodiments of the invention.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-53 which may be considered as a "gate-last" or "replacement-gate" process, and starting with FIGS. 1 and 2.

Figure 1:
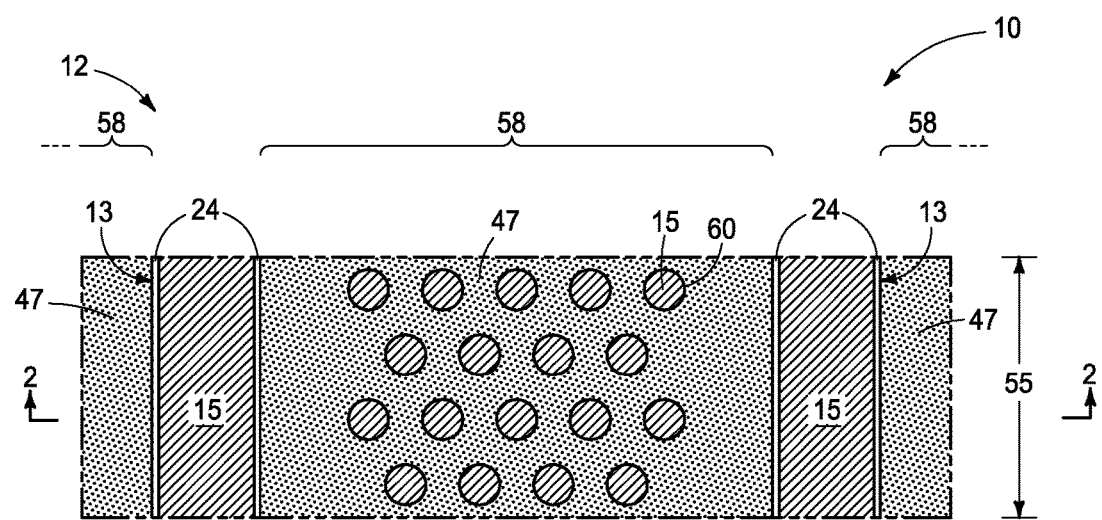
FIG. 1 is a diagrammatic cross-sectional view of a portion of a substrate in process in accordance with an embodiment of the invention and is taken through line 1-1 in FIG. 2.
Figure 2:
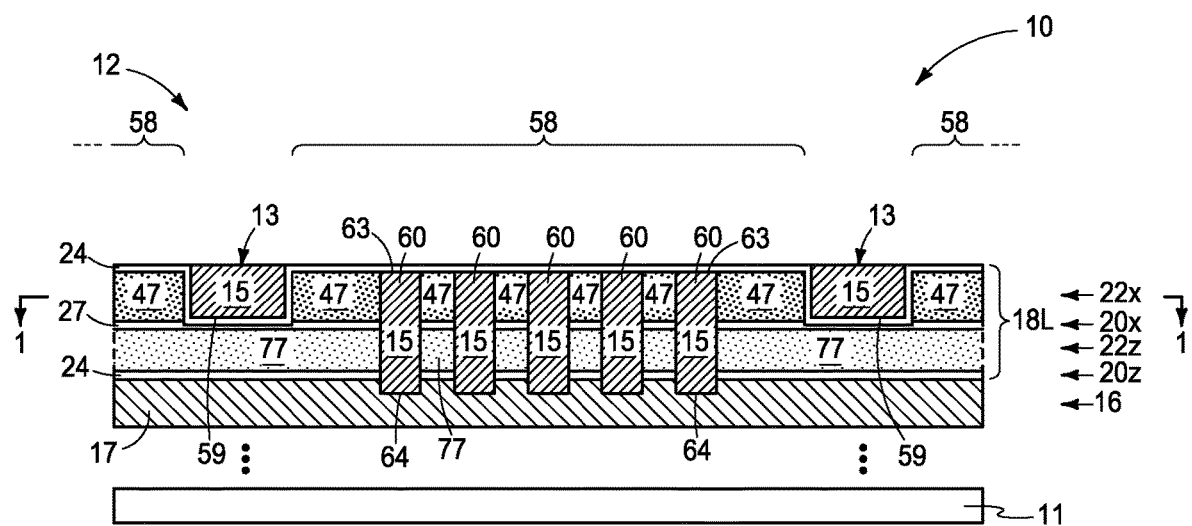
FIG. 2 is a diagrammatic cross-sectional view taken through line 2-2 in FIG. 1.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/ semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

In some embodiments and as shown, a conductor tier 16 comprising conductor material 17 (e.g., conductively-doped polysilicon atop WSix) has been formed above substrate 11. Conductor tier 16 may comprise part of control circuitry (e.g., peripheral-under-array circuitry and/or a common source line or plate) used to control read and write access to the transistors and/or memory cells that will be formed within array 12.

A lower portion 18L of a stack 18* has been formed above substrate 11 and conductor tier 16 when present (an * being used as a suffix to be inclusive of all such same-numerically-designated components that may or may not have other suffixes). Stack 18* will comprise vertically-alternating conductive tiers 22* and insulative tiers 20*. Example lower portion 18L is shown as comprising two insulative tiers 20* and two conductive tiers 22*. More insulative tiers 20*, more conductive tiers 22*, less insulative tiers 20*, or less conductive tiers 22* may alternately be provided in lower portion 18L (not shown). Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". Example conductive tiers 22* comprise first material 26 (e.g., silicon nitride) which may be wholly or partially sacrificial. Example insulative tiers 20* comprise second material (e.g., 24, 27; such as one or more insulative oxides including, for example, silicon dioxide) that is of different composition from that of first material 26 and which may be wholly or partially sacrificial. In one embodiment, a lowest first tier 22z comprises first sacrificial material 77 (e.g., polysilicon or silicon nitride, and may be of the same or different composition from that of material of first tiers 22* thereabove and/or that will be formed there-above). In one embodiment, a next-lowest first tier 22x comprises conductively-doped polysilicon 47.

Example thickness for each of tiers 20* and 22* is 20 to 60 nanometers. In one embodiment and as shown, lowest first tier 22z is not directly against conductor material 17 of conductor tier 16, for example where a lowest second tier 20z is vertically between conductor material 17 of conductor tier 16 and lowest first tier 22z. Alternately, the lowest first tier may be directly against the conductor material of the conductor tier (not shown). In one embodiment, lowest second tier 20z is directly against a top 19 of conductor material 17 of conductor tier 16. A silicon nitride layer (not shown) may be between second material 24 and first sacrificial material 77, and thereby be a part of insulative tier 20z. A silicon nitride layer (not shown) may be between second material 27 and first-tier material 47, and thereby be a part of insulative tier 20x.

Stack 18* comprises laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may not be discernable at this point of processing.

In one embodiment, horizontally-elongated lines 13 have been formed in in next-lowest first tier 22x (and in one embodiment in tier 20x). Lines 13 are individually between immediately-laterally-adjacent memory-block regions 58. Lines 13 comprise second sacrificial material 15 which, in one embodiment, is of different composition from first sacrificial material 77. In some embodiments, "second sacrificial material" is just referred to as "sacrificial material". In one embodiment, second sacrificial material 15 is of different composition from first-tier material that is (e.g., 47) or will be formed above first sacrificial material 77 and from second-tier material that is (e.g., 27) or will be formed above first sacrificial material 77, In one embodiment, second sacrificial material 15 is of different composition from material 47 of next-lowest conductive first tier 22x. In one embodiment, second sacrificial material 15 comprises metal material, for example elemental tungsten above a thin layer of TiN. In one embodiment, an insulator material 24 (e.g., silicon dioxide) may formed in trenches formed in materials 47 and 27 as shown before forming material 47 and thereby be laterally between materials 47 and 15 as shown. Regardless, lines 13 may taper laterally-inward (not shown) moving deeper into lower stack portion 18L. Lines 13 may be considered as having bottom surfaces 59. In one embodiment and as shown, individual bottom-line surfaces 59 are everywhere above lowest first tier 22z.

In one embodiment, pillars 60 have been formed in lower portion 18L, pillars 60 are horizontally-located (i.e., in x, y coordinates) where individual channel-material-string structures will be formed. By way of example and for brevity only, pillars 60 are shown as being arranged in groups or columns of staggered rows of four and five pillars 60 per row. In one embodiment, pillars 60 comprise second sacrificial material 15. Pillars 60 may taper radially-inward (not shown) moving deeper into lower stack portion 181L. Pillars 60 may be considered as having bottom surfaces 64 and uppermost surfaces 63. In embodiments where both of pillars 60 and lines 13 are formed, such may be formed at the same time or at different times.

In one embodiment, pillar-bottom surfaces 64 and line-bottom surfaces 59 are at different depths relative one another. In one such embodiment, the pillar-bottom surfaces 64 are deeper than line-bottom surfaces 59, and in one such latter embodiment are in conductor tier 16 (e.g., directly against conductor material 17). In one embodiment, pillar-uppermost surfaces 63 are individually above lowest first tier 22z.

Figure 3:
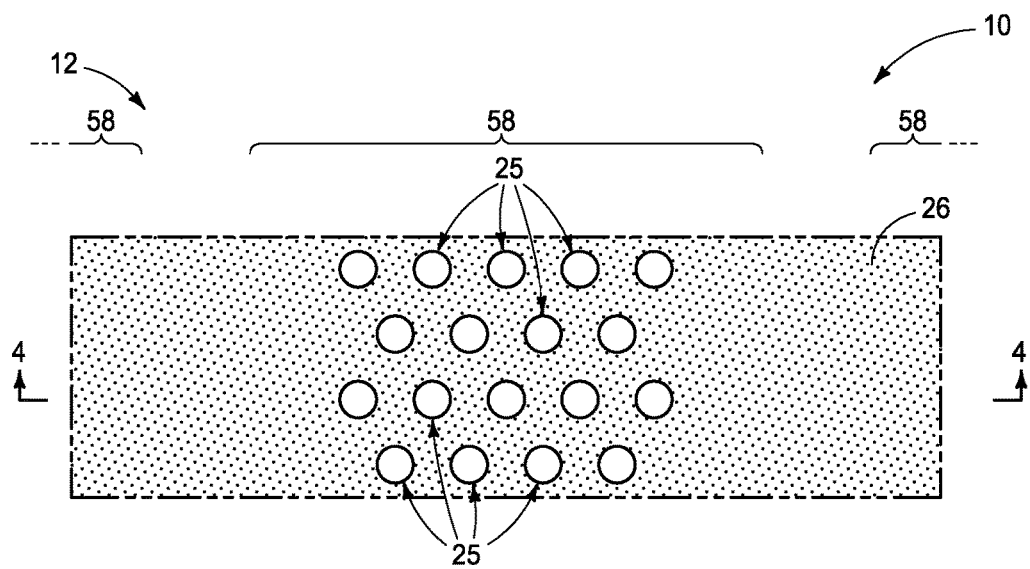
FIGS. 3-10 and 14-38 are diagrammatic sequential sectional, expanded, enlarged, and/or partial views of the construction of FIGS. 1 and 2, or portions thereof, in process in accordance with some embodiments of the invention.
Figure 4:
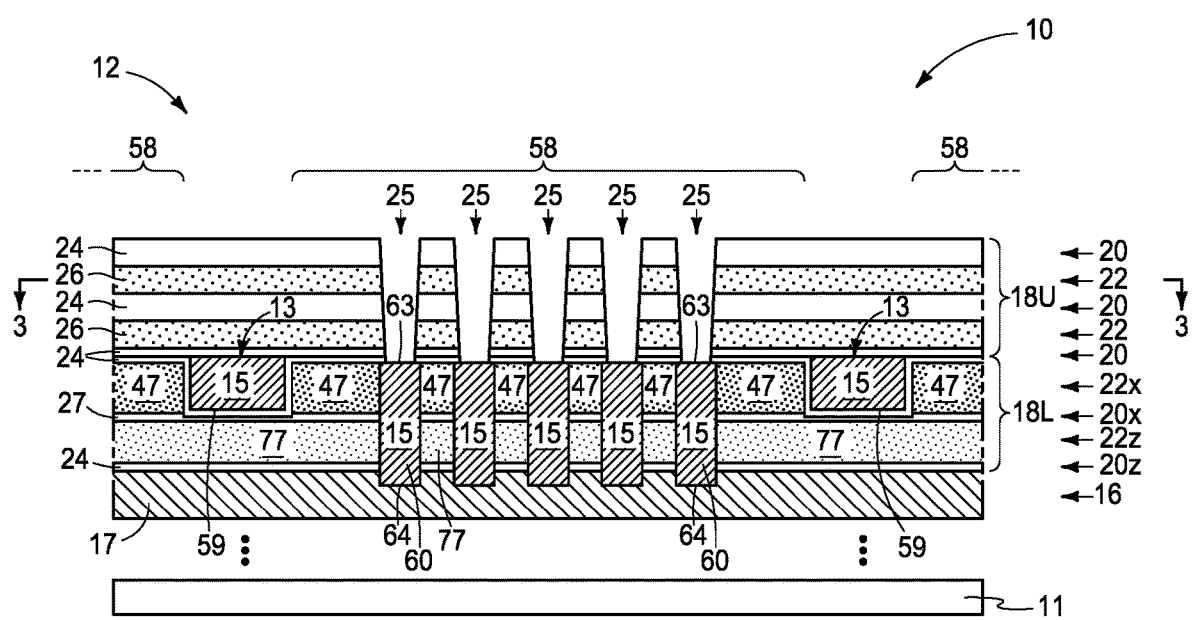

Referring to FIGS. 3 and 4, vertically-alternating first tiers 22 and second tiers 20 of an upper portion 18U of stack 18* have been formed above lower portion 18L (and lines 13 and/or pillars 60 when present). Example upper portion 18U is shown starting above lower portion 18L with a second tier 20 although such could alternately start with a first tier 22

(not shown). Regardless, only a small number of tiers 20 and 22 is shown, with more likely upper portion 18U (and thereby stack 18*) comprising dozens, a hundred or more, etc. of tiers 20* and 22*. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of the conductive tiers 22* and/or above an uppermost of the conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

Channel openings 25 have been formed (e.g., by etching) through insulative tiers 20 and conductive tiers 22 in upper portion 18U to lower portion 18L and individually to pillars 60 when present. Alternately, channel openings 25 may extend to lowest first tier 22z (including to therein or to there-below) if pillars 60 are not present. Regardless, channel openings 25 may taper radially-inward (as shown) moving deeper into upper stack portion 18U.

Figure 5:
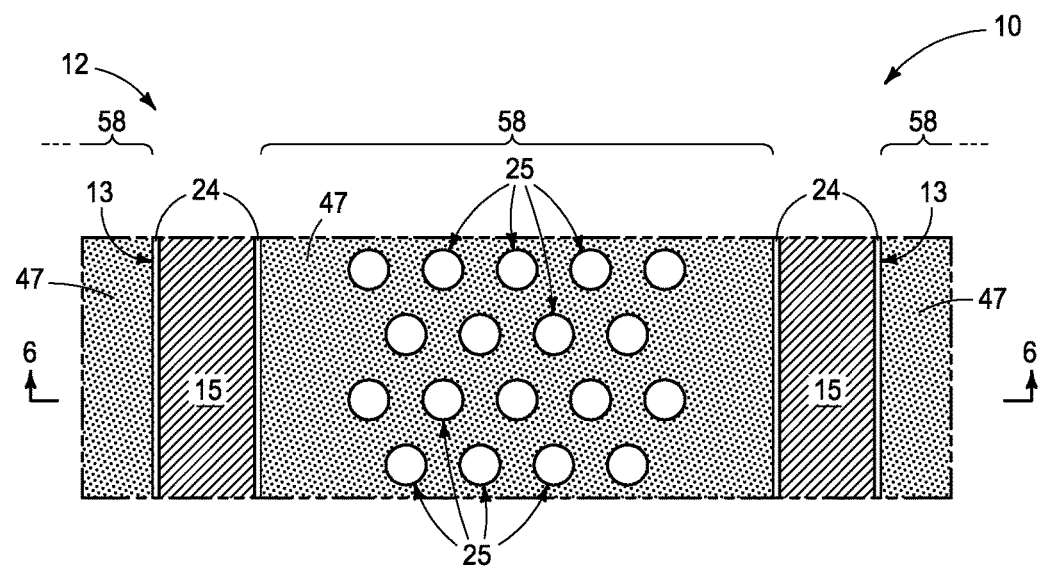
Figure 6:
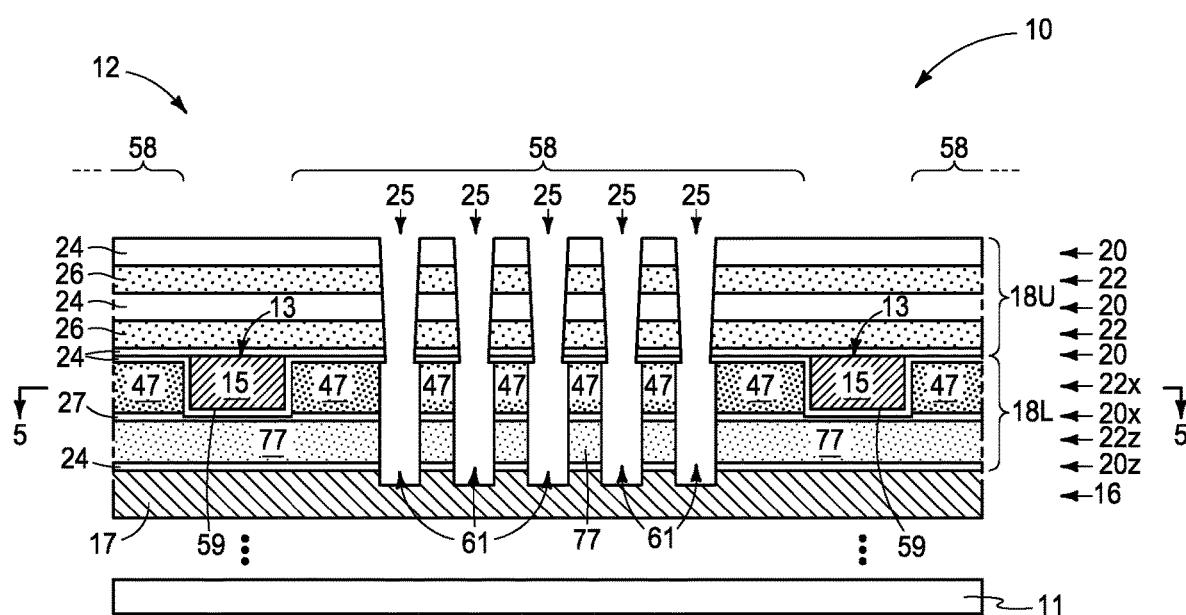
Figure 7:
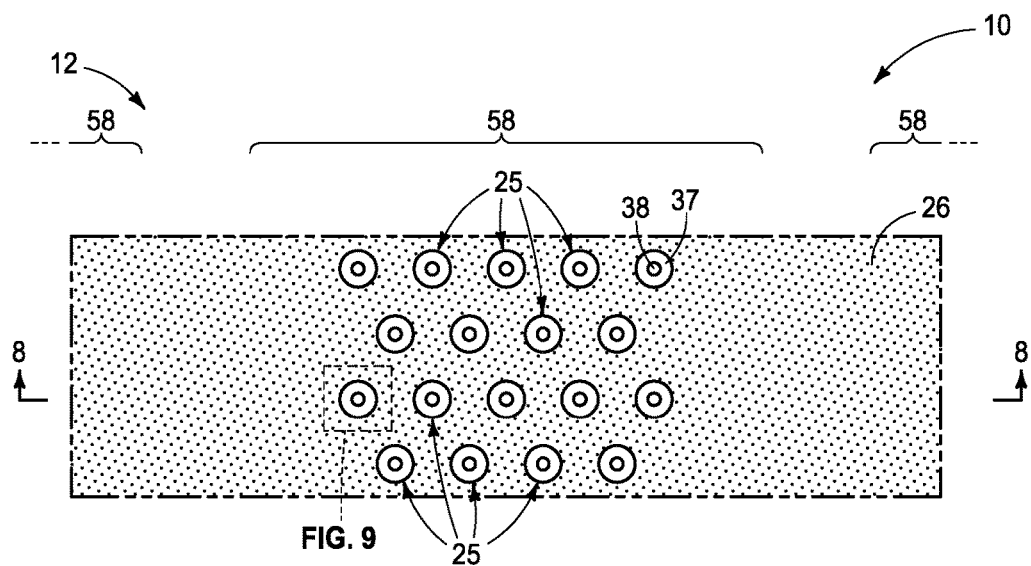
Figure 8:
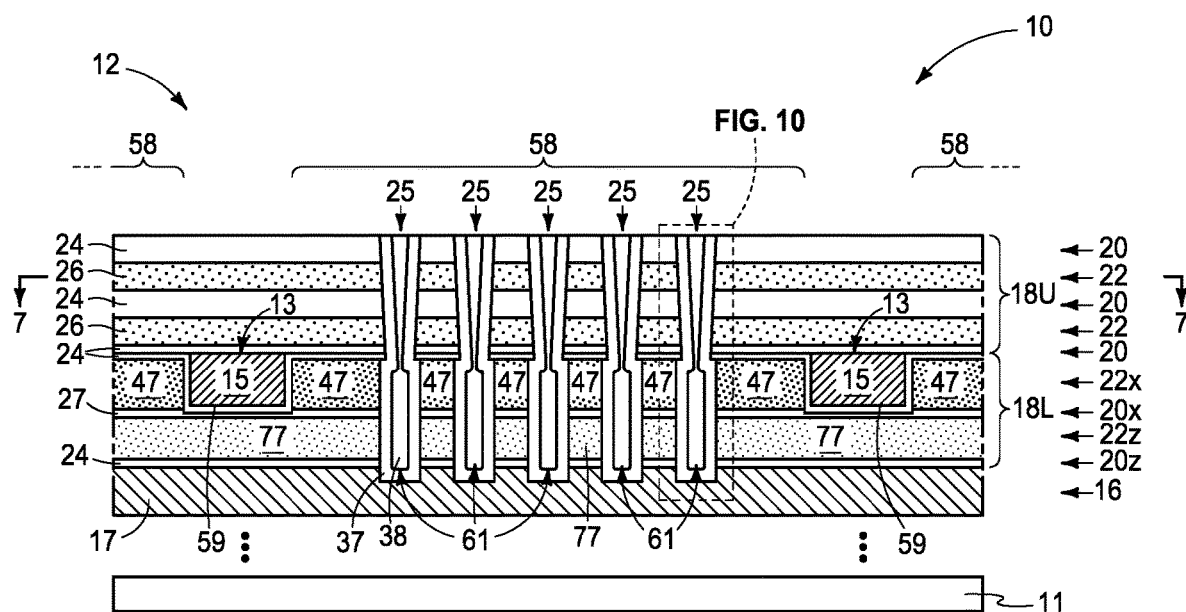
Figure 9:
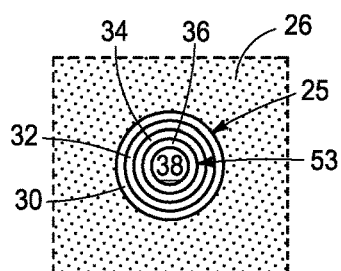

Referring to FIGS. 5 and 6, pillars 60 (not shown) have been removed (e.g., by isotropic etching) through channel openings 25 thereby effectively extending channel openings 25 into individual void-spaces 61 resulting from the removing of pillars 60 and to lowest first tier 22z. The artisan is capable of selecting a suitable isotropic etching chemistry that will etch pillar material 15 selectively relative to other exposed materials. As an example, a W material 15 can be isotropically etched selectively relative to $SiO_2$ and $Si_3N_4$ using a mixture of ammonia and hydrogen peroxide or a mixture of sulfuric acid and hydrogen peroxide.

Figure 10:
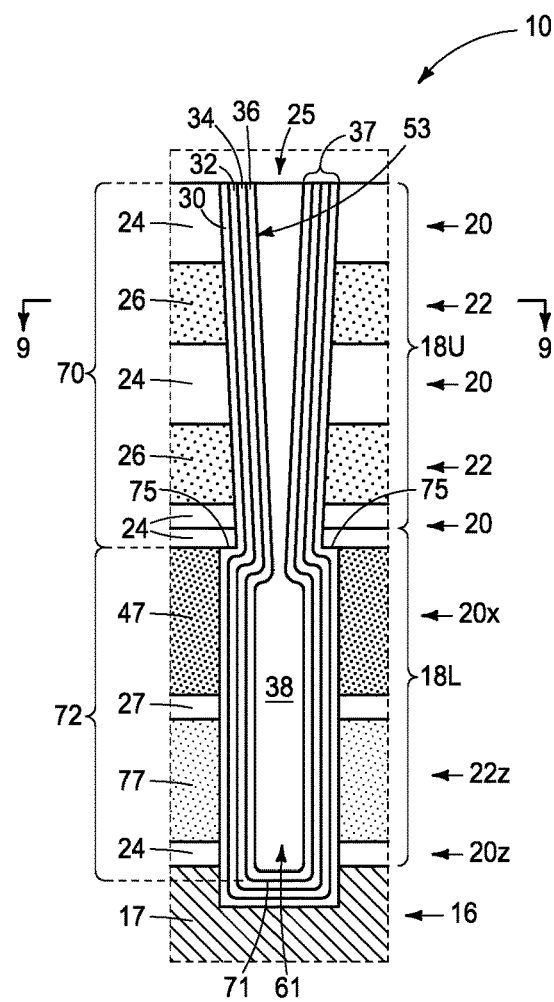
Figure 11:
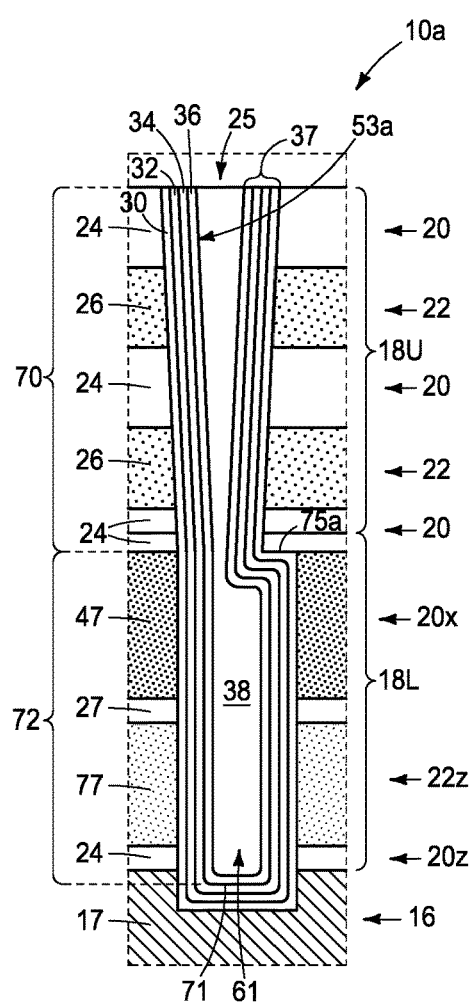

Referring to FIGS. 7-10, transistor channel material 36 has been formed in individual channel openings 25 and void-spaces 61 elevationally along the first tiers and the second tiers. Channel material 36 will be directly electrically coupled with conductive material 17 in conductor tier 16. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material. FIGS. 10 and 11 show one embodiment wherein charge-blocking material 30, storage material 32, and charge-passage material 34 have been formed in individual channel openings 25 elevationally along insulative tiers 20* and conductive tiers 22*. Transistor materials 30, 32, and 34 (e.g., memory-cell materials) may be formed by, for example, deposition of respective thin layers thereof over stack 18* and within individual openings 25 followed by planarizing such back at least to a top surface of stack 18*. Collectively, channel material 36 along with materials 30, 32, and 34 may be considered as comprising individual channel-material-string structures 53 that extend through first tiers 22* and second tiers 20* in upper portion 18U to lowest first tier 22z in lower portion 18L.

Channel material 36 may be considered as having a lowest surface 71 thereof. Channel-material-string structures 53 in one embodiment have memory-cell materials (e.g., 30, 32, and 34) there-along and with second-tier material (e.g., 24) being horizontally-between immediately-adjacent channel-material-string structures 53. Materials 30, 32, 34, and 36 are collectively shown as and only designated as material 37 in FIGS. 13 and 14 due to scale. Example channel materials 36 include appropriately-doped crystalline semiconductor material, such as one or more silicon, germanium, and so-called III/V semiconductor materials (e.g., GaAs, InP, GaP, and GaN), Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

In one embodiment, channel-material-string structures 53 may be considered as individually comprising an upper portion 70 above and joined with a lower portion 72. Individual channel-material-string structures 53 comprise at least one external jog surface 5 (FIG. 10) in a vertical cross-section (e.g., that of FIGS. 8 and 10) where upper portion 70 and lower portions 72 join (i.e., a "jog surface" herein being characterized by an abrupt change in direction [at least 15°] in comparison to external surfaces of a channel-material-string structure that are mmediately-above and immediately-below the jog surface). One or more jog surfaces 75 may form due to radially inward taper of channel openings 25 moving deeper into upper stack portion 18U in comparison to a larger uppermost radial extent of void-spaces 61 left by removal of pillars 60 (as shown). Alternately and/or additionally, one or more jog surfaces 75 may result from misalignment (not shown in FIGS. 7-10) of channel openings 25 relative to former pillars 60, for example as is described below.

In one embodiment, the at least one external jog surface 75 is horizontal (as shown) or within 10° of horizontal. Example individual channel-material-string structures 53 comprise two jog surfaces 75, and which in one embodiment are angled from vertical the same relative one another (e.g., each being horizontal in the one example and thereby each being angled 90° from vertical).

FIG. 11 shows an example alternate embodiment construction 10a. Like numerals from the above-described embodiments have been used where appropriate, with some construction differences being indicated with the suffix "a" or with different numerals. Individual channel-material-string structures 53a comprise only one jog surface 75a, for example that might occur due to slight misalignment of channel openings 25 relative to former pillars 60. Any other attribute(s) or aspect(s) as shown and/or described herein with respect to other embodiments may be used.

Figure 12:
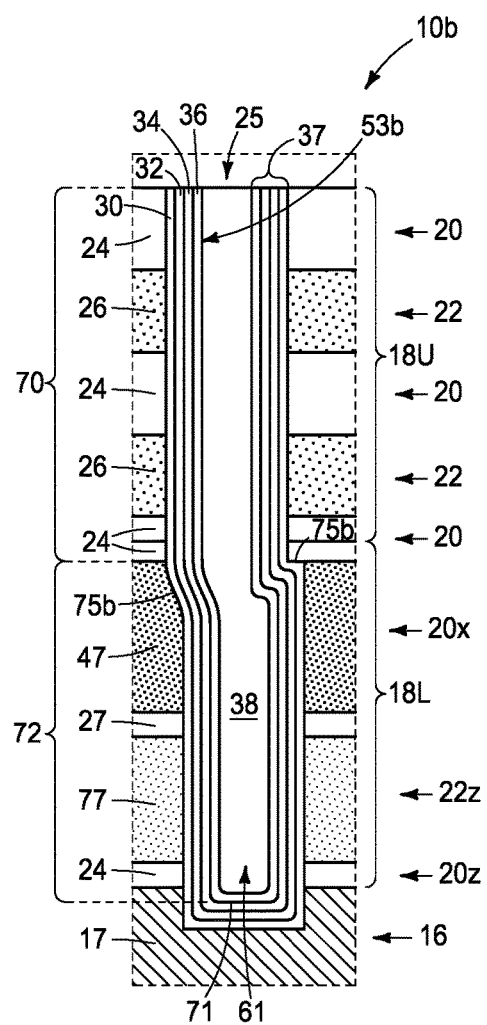

FIG. 12 shows an example alternate embodiment construction 10b. Like numerals from the above-described embodiments have been used where appropriate, with some construction differences being indicated with the suffix "b" or with different numerals. Individual channel-material-string structures 53b comprise at least one jog surface 75b that is not horizontal (e.g., two jog surfaces 75b being shown, one of which is horizontal and one of which is not horizontal). In one embodiment, jog surface 75b that is not horizontal is more than 10° from horizontal, in one such embodiment is at least 22.5° from horizontal, and in one such is embodiment is at least 45° from horizontal (about 66° from horizontal being shown, and thereby about 24° from each of example externa; vertical surfaces of channel-material-string structure 53 above and below jog surfaces 75b). Any other attribute(s) or aspect(s) as shown and/or described herein with respect to other embodiments may be used.

FIG. 12 shows an example alternate embodiment construction 10b. Like numerals from the above-described embodiments have been used where appropriate, with some construction differences being indicated with the suffix "b" or with different numerals. Individual channel-material-string structures 53b comprise at least one jog surface 75b that is not horizontal (e.g., two jog surfaces 75b being shown, one of which is horizontal and one of which is not horizontal). In one embodiment, jog surface 75b that is not horizontal is more than 10° from horizontal, in one such embodiment is at least 22.5° from horizontal, and in one such is embodiment is at least 45° from horizontal (about 66° from horizontal being shown, and thereby about 24° from each of example; external vertical surfaces of channel-material-string structure 53 above and below jog surfaces 75b). Any other attribute(s) or aspect(s) as shown and/or described herein with respect to other embodiments may be used.

Figure 13:
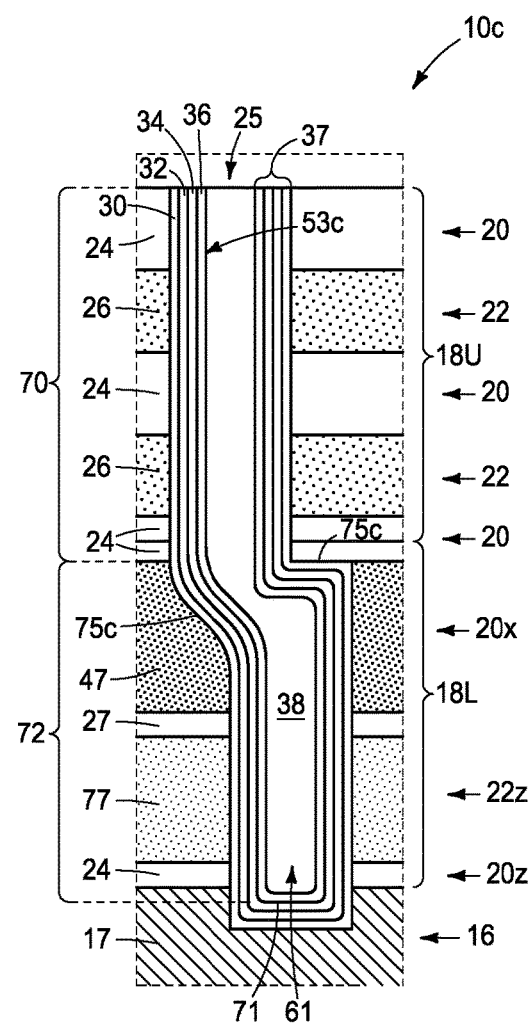
Figure 14:
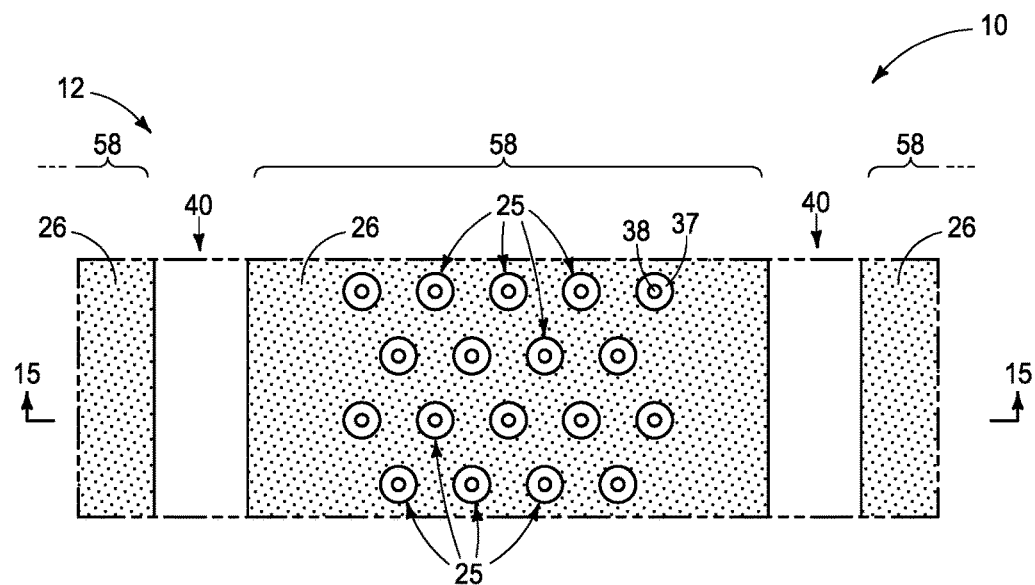
Figure 15:
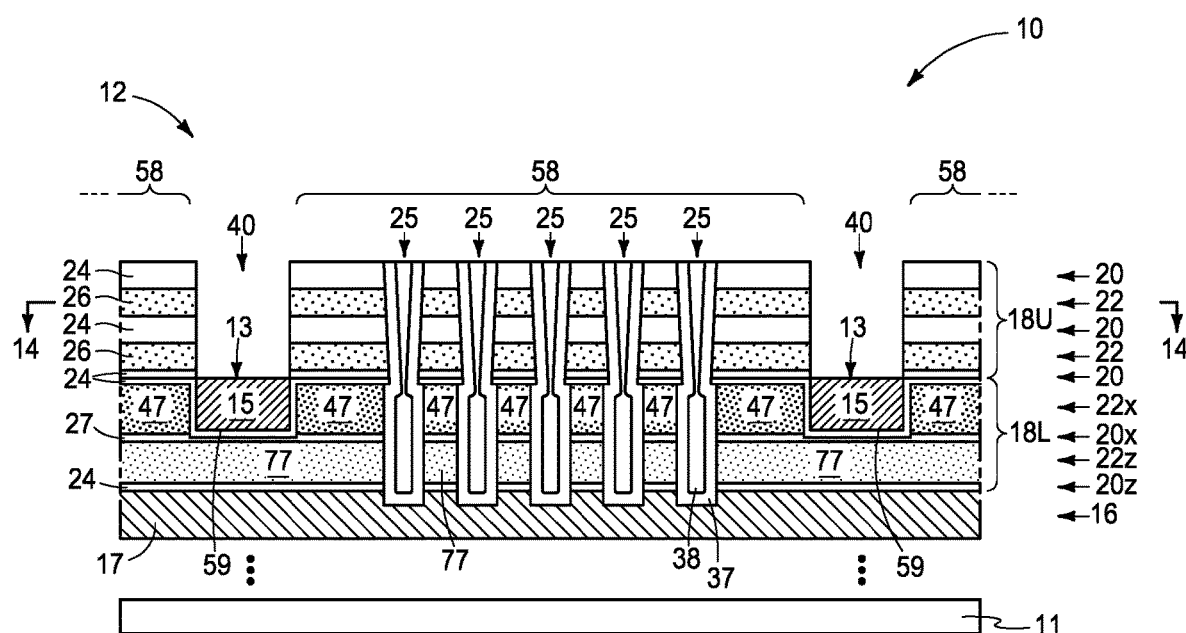

FIG. 13 shows an example alternate embodiment construction 10c wherein individual channel-material-string structures 53c comprise a jog surface 75c that is 45° from horizontal (the left one). Like numerals from the above-described embodiments have been used where appropriate, with some construction differences being indicated with the suffix "c" or with different numerals. Any other attribute(s) or aspect(s) as shown and/or described herein with respect to other embodiments may be used.

Figure 16:
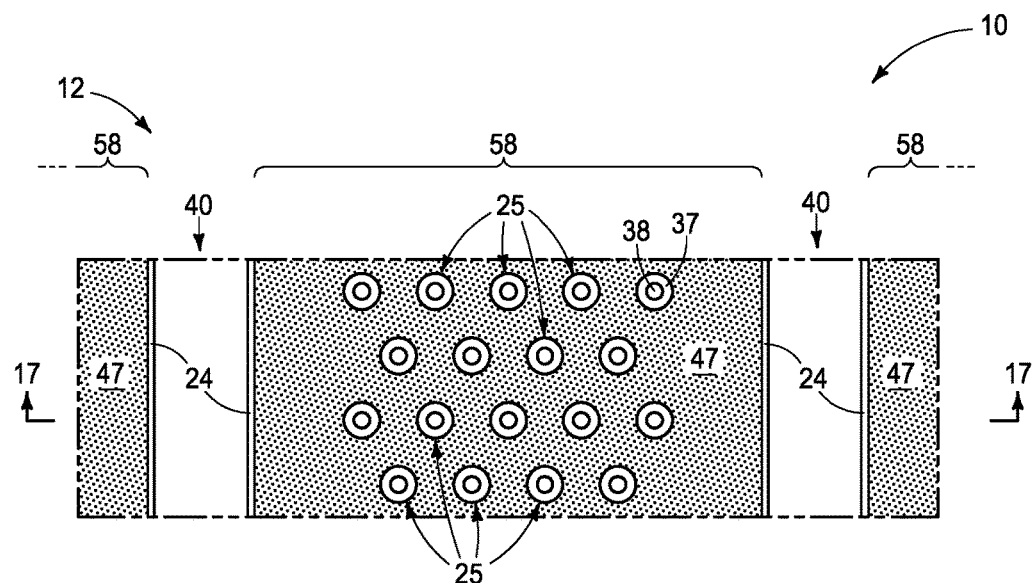
Figure 17:
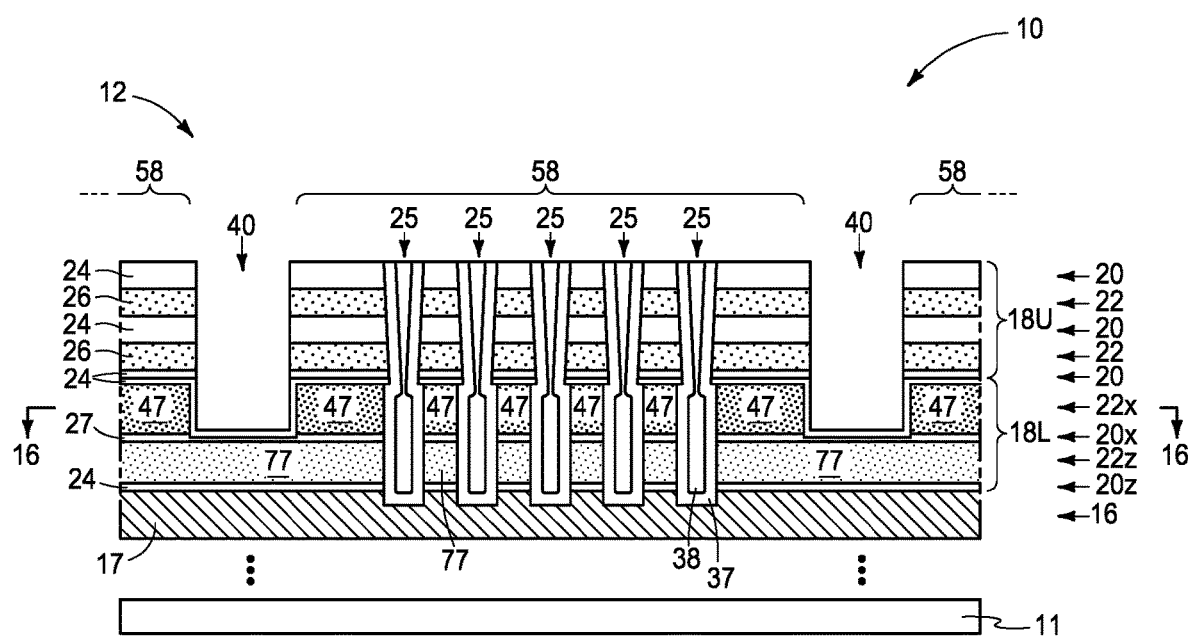

Referring to FIGS. 16 and 17, second sacrificial material 15 (not shown) of lines 13 (not shown) has been removed through trenches 40 (e.g., by isotropic etching using a mixture of ammonia and hydrogen peroxide or a mixture of sulfuric acid and hydrogen peroxide if material 15 comprises W). Intervening material (not yet shown) is ultimately formed in trenches 40 and void-spaces left as a result of the removing of second sacrificial material 15 of lines 13.

Any other attribute(s) or aspect(s) as shown and/or described herein with respect to other embodiments may be used in the embodiments shown and described with reference to the above embodiments. In some embodiments, other and/or additional processing occurs, for example as described below.

Figure 18:
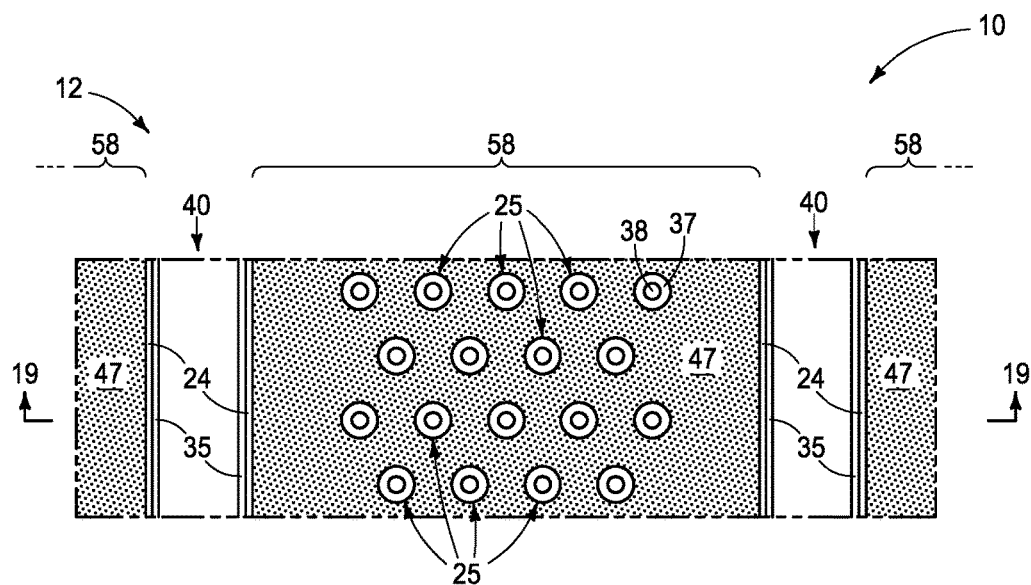
Figure 19:
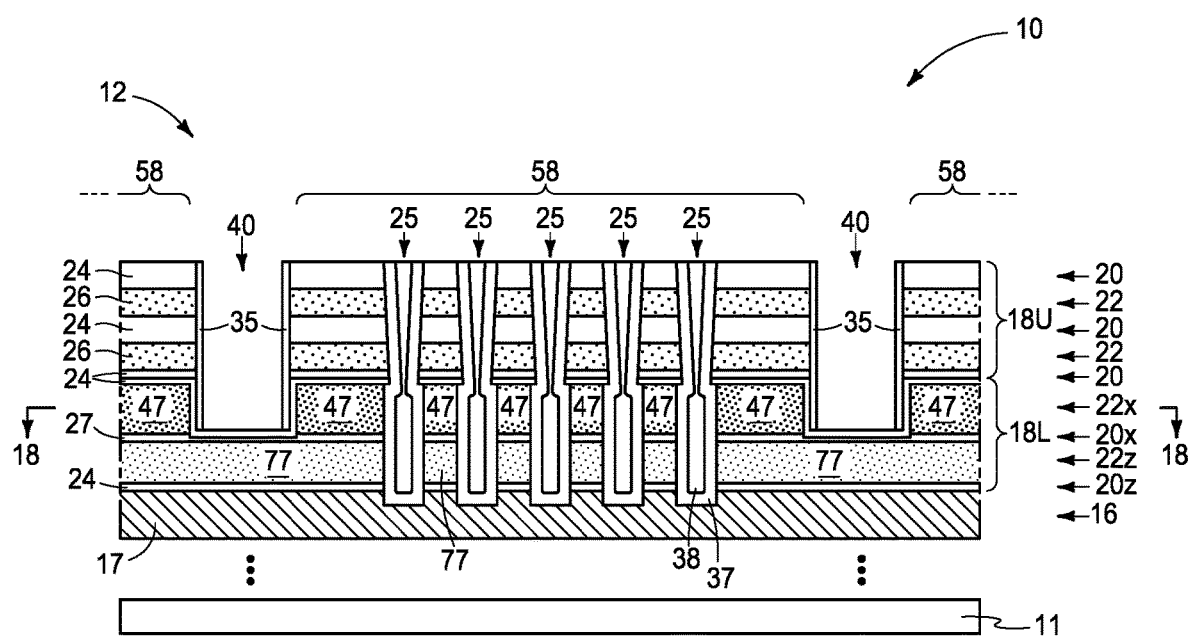

Referring to FIGS. 18 and 19, trenches 40 have been optionally lined with lining material 35 (e.g., 35 being hafnium oxide, aluminum oxide, silicon dioxide, silicon nitride, etc.). Lining material 35 may be partly or wholly sacrificial and ideally is of a composition other than that of materials 24 and 26. After deposition of lining material 35, it has been substantially removed from being over horizontal surfaces, for example by maskless anisotropic spacer-like etching thereof.

Figure 20:
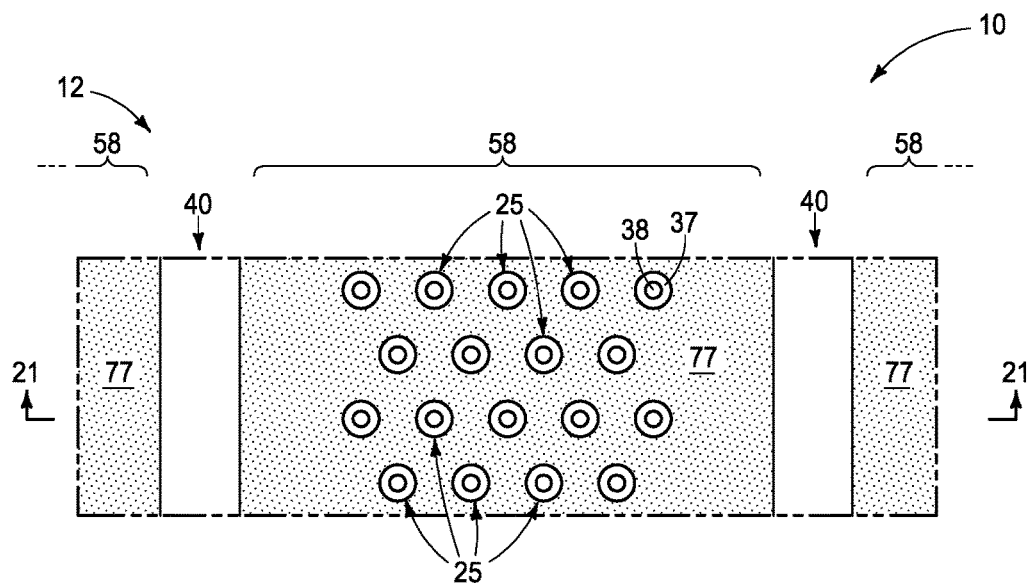
Figure 21:
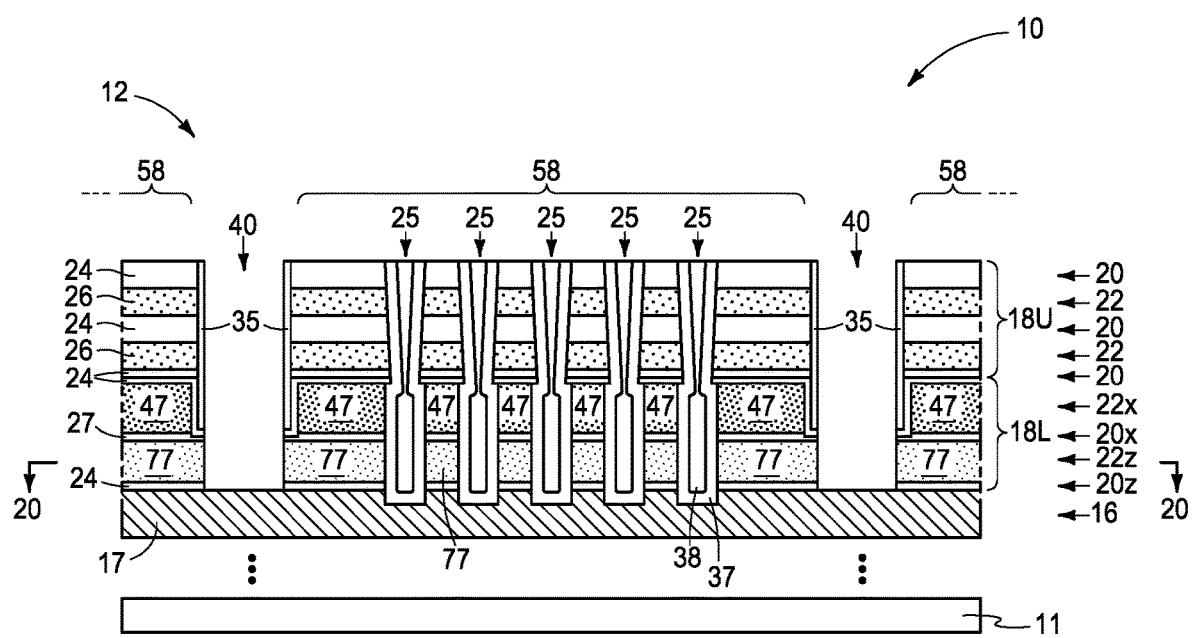

Referring to FIGS. 20 and 21, trenches 40 have been extended to conductor material 17 of conductor tier 16 (e.g., by etching through materials 27, 77, and 24).

Figure 22:
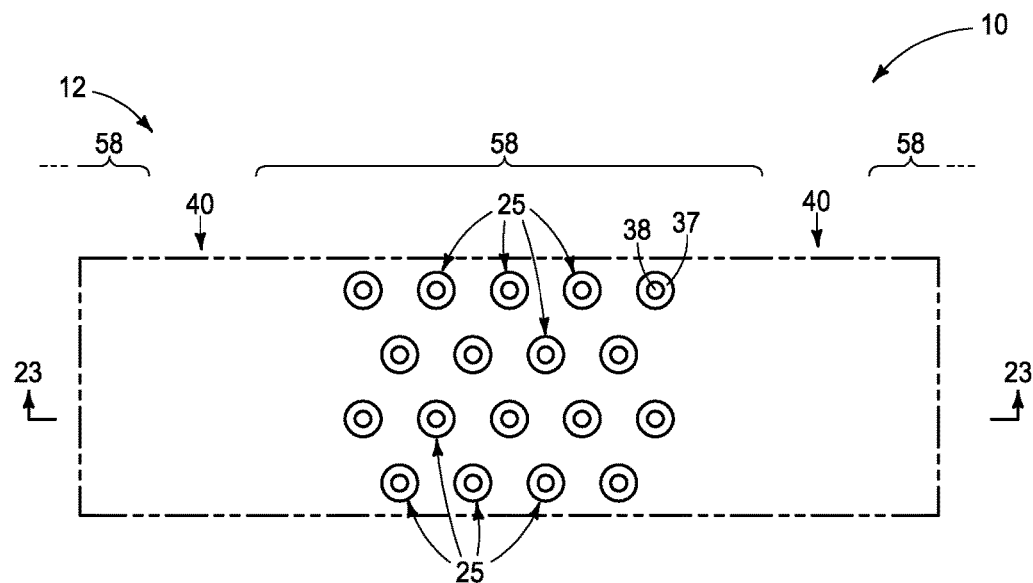
Figure 23:
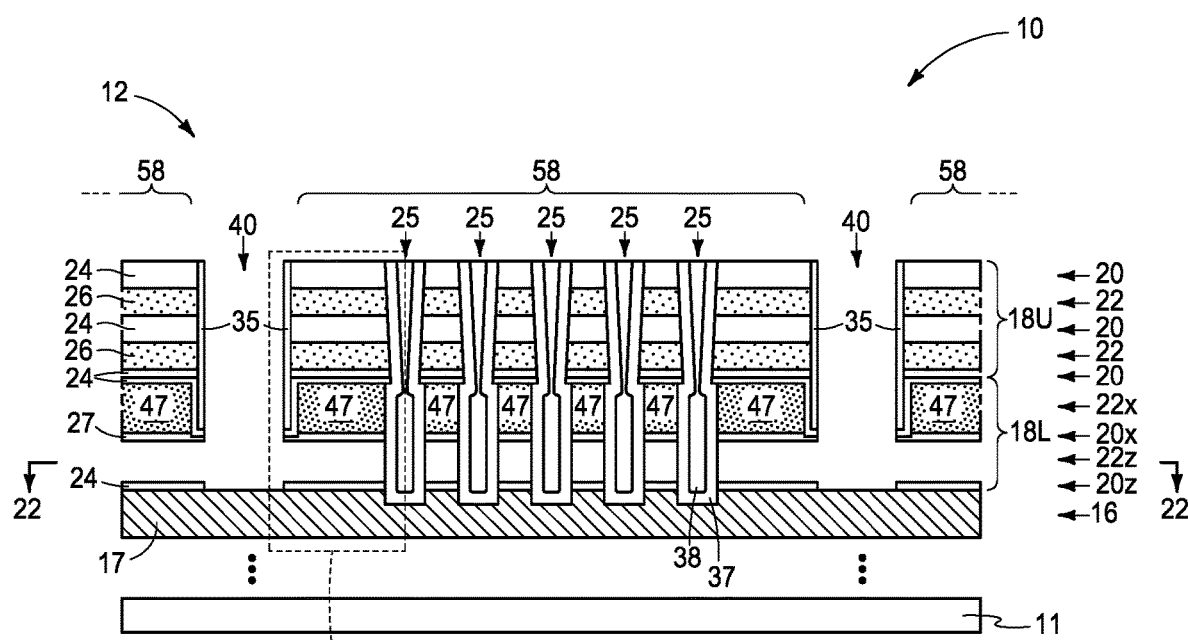
Figure 24:
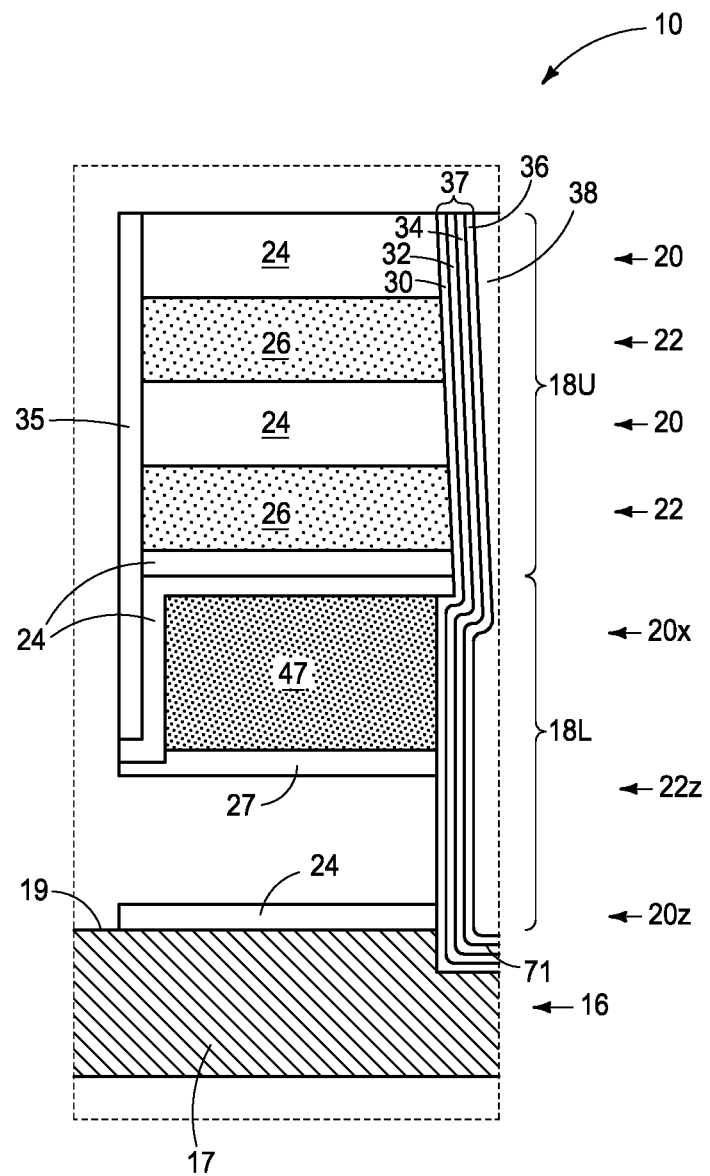

Referring to FIGS. 22-24, first sacrificial material 77 (not shown) has been isotropically etched from lowest first tier 22z through trenches 40 (e.g., using liquid or vapor $H_3PO_4$ as a primary etchant where material 77 is silicon nitride and exposed other materials comprise one or more oxides or polysilicon or using tetramethyl ammonium hydroxide [TMAH] where material 77 is polysilicon). If first-tier material 26 and first sacrificial material 77 are of the same composition, sidewalls of first-tier material 26 have been masked by lining material 35 which precludes material 26 from being etched while etching first sacrificial material 77.

Figure 25:
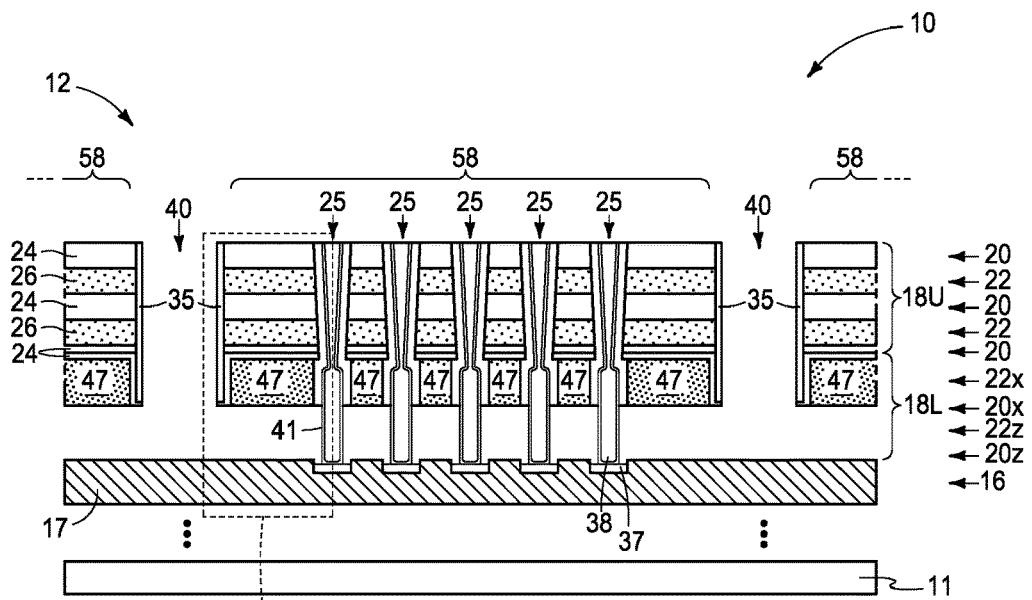
Figure 26:
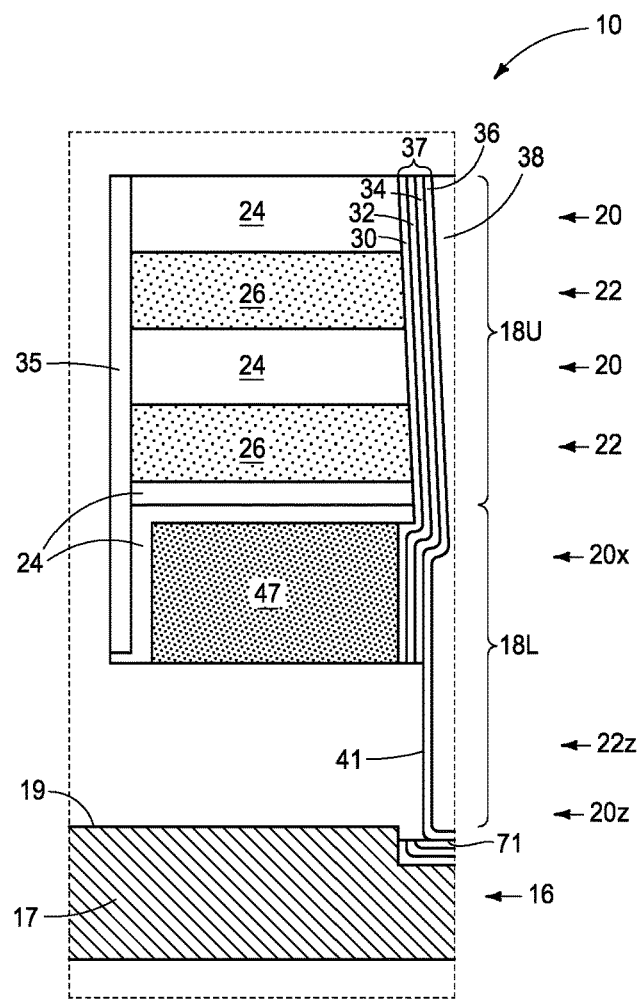

In one embodiment, a sidewall of the channel material of the channel-material-string structures in the lowest first tier is exposed. FIGS. 25 and 26 show example such subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in tier 20z to expose a sidewall 41 of channel material 36 of channel-material-string structures 53 in lowest first tier 22z. Any of materials 30, 32, and 34 in tier 22z may be considered as being sacrificial material therein. As an example, consider an embodiment where materials 35 is one or more insulative oxides (other than silicon dioxide), materials 47 and 36 are polysilicon, and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example construction shown by FIGS. 25 and 26. The artisan is capable of selecting other chemistries for etching other different materials where a construction as shown in FIGS. 25 and 26 is desired.

Figure 27:
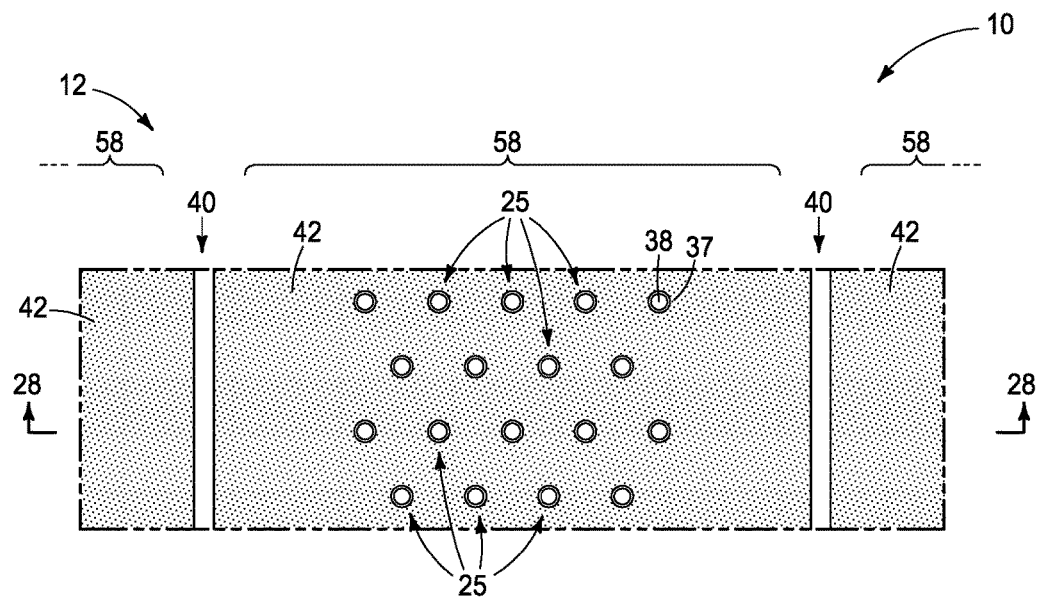
Figure 28:
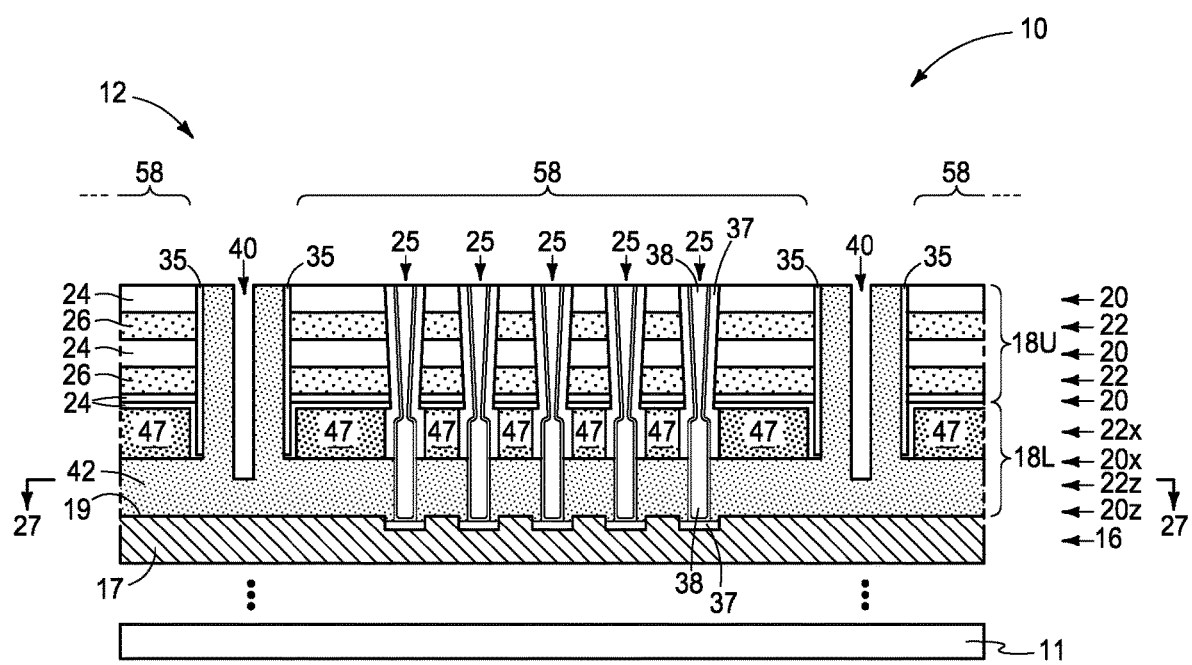

Referring to FIGS. 27 and 28, and in one embodiment, conductive material 42 has been deposited into void-space in lowest first tier 22z left as a result of removing first sacrificial material 77. In one such embodiment, conductive material 42 is directly against exposed sidewall 41 of the channel material 36 of channel-material-string structures 53 in lowest first tier 22z and in one embodiment is directly against an uppermost surface 19 of conductor material 17 of conductor tier 16. Such is but one example whereby conductive material 42 has been deposited to directly electrically couple together channel material 36 of individual channel-material-string structures 53 and conductor material 17 of conductor tier 16 (e.g., through channel-material sidewall 41). Example conductive materials 42 are conductively-doped semiconductor material (e.g., conductively-doped polysilicon) and metal material. Conductive material 42 may be directly against first-tier material 47. Conductive material 42 may not be directly against first-tier material 47 (not shown), for example if a silicon nitride layer (not shown and referred to above) was between second material 27 (not shown) and first-tier material 47. First-tier material 47 may or may not be in the finished construction, and if so may or may not be circuit inoperative.

Figure 29:
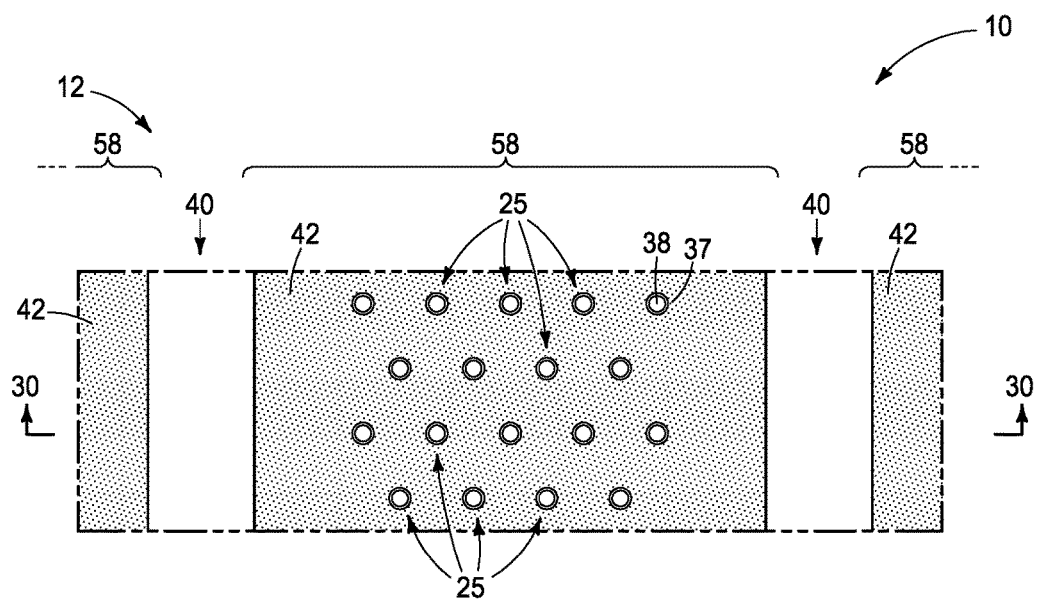
Figure 30:
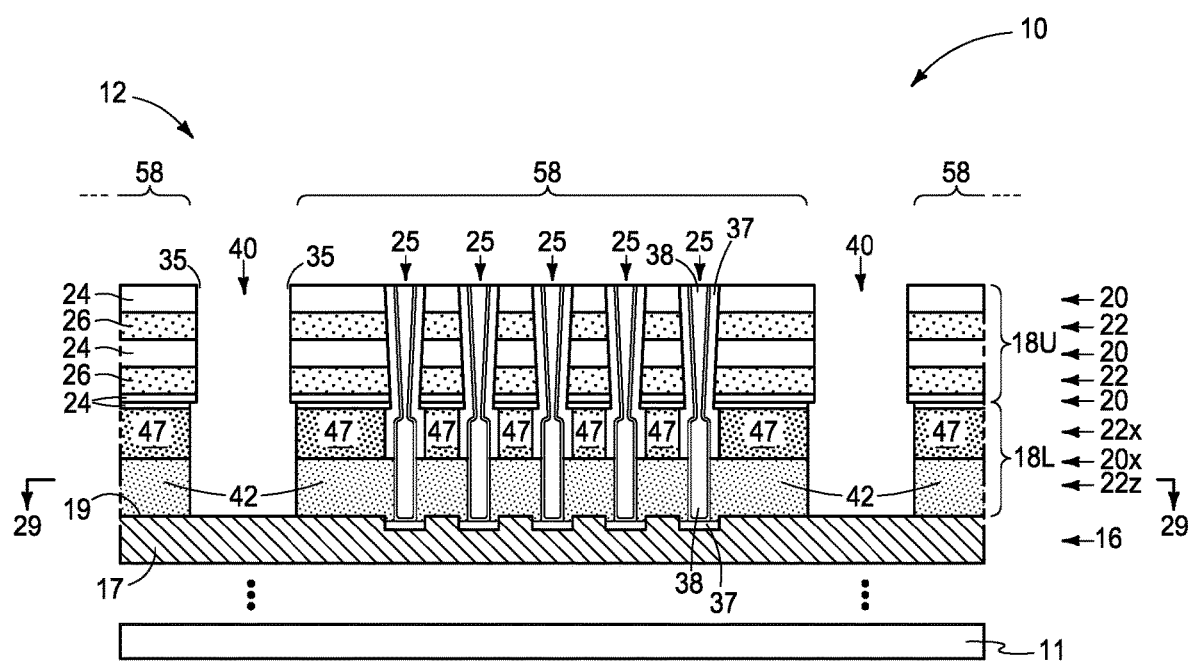

Referring to FIGS. 29 and 30, conductive material 42 has been removed from trenches 40, for example by timed isotropic or anisotropic etching that may be conducted selectively relative to materials 24, 26, 17, and 47. Such may result in removal of lining material 35 as shown or such may be separately removed. Alternately, lining material 35 may have been removed earlier (not shown). A reason for removing lining material 35 is to provide access to material 26 in second tiers 22 for removal thereof in a replacement-gate process. The etching of conductive material 42 may result in some etching of conductor material 17 when exposed (not shown). Example etching chemistries where material 42 is conductively-doped polysilicon, material 24 is silicon dioxide, material 26 is silicon dioxide is HBr (anisotropic) and TMAH (isotropic).

Figure 31:
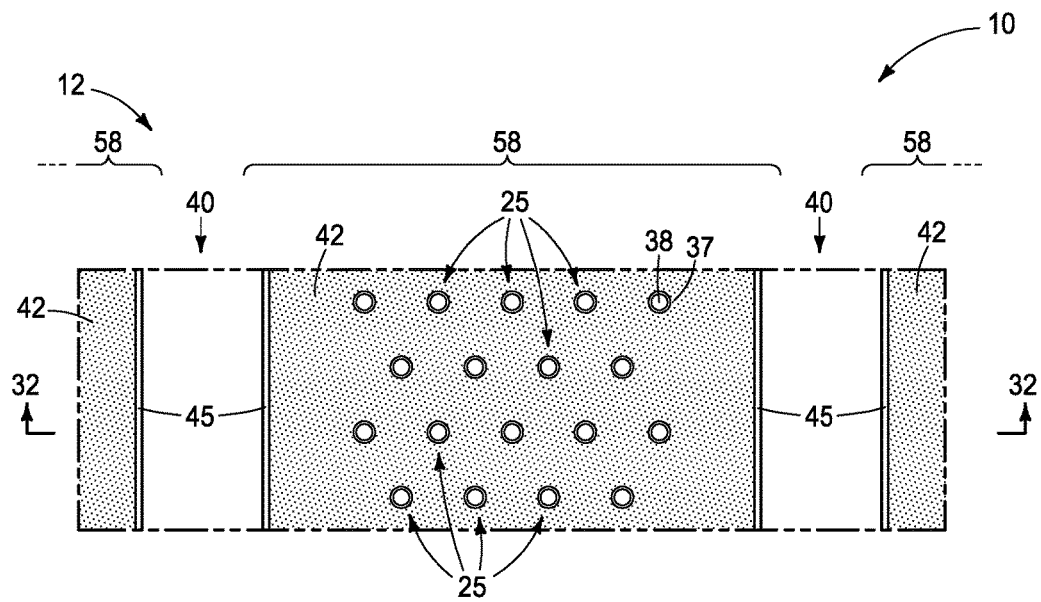
Figure 32:
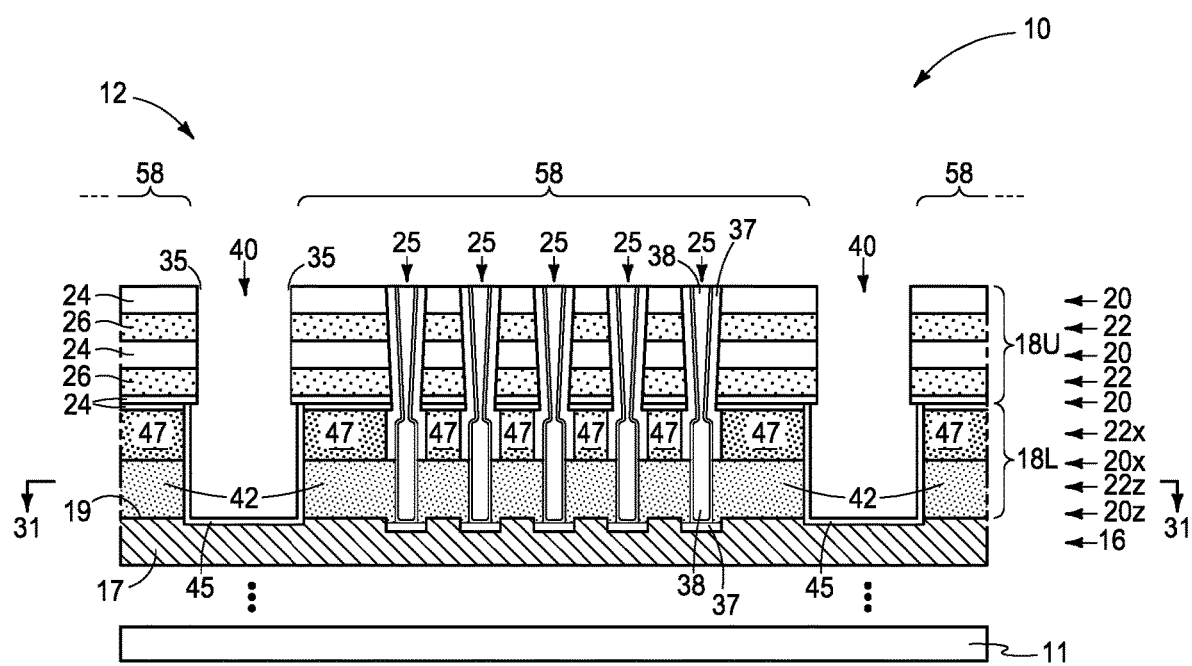
Figure 33:
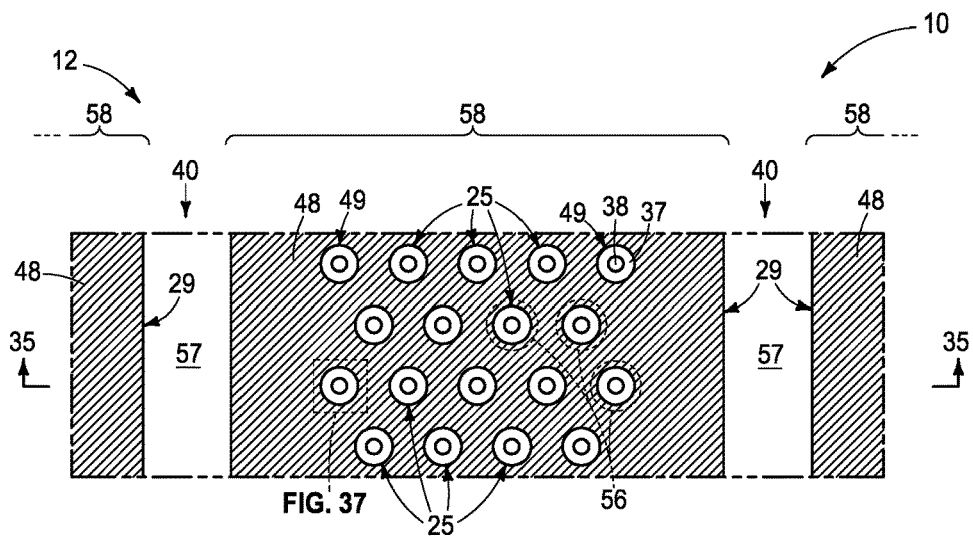
Figure 34:
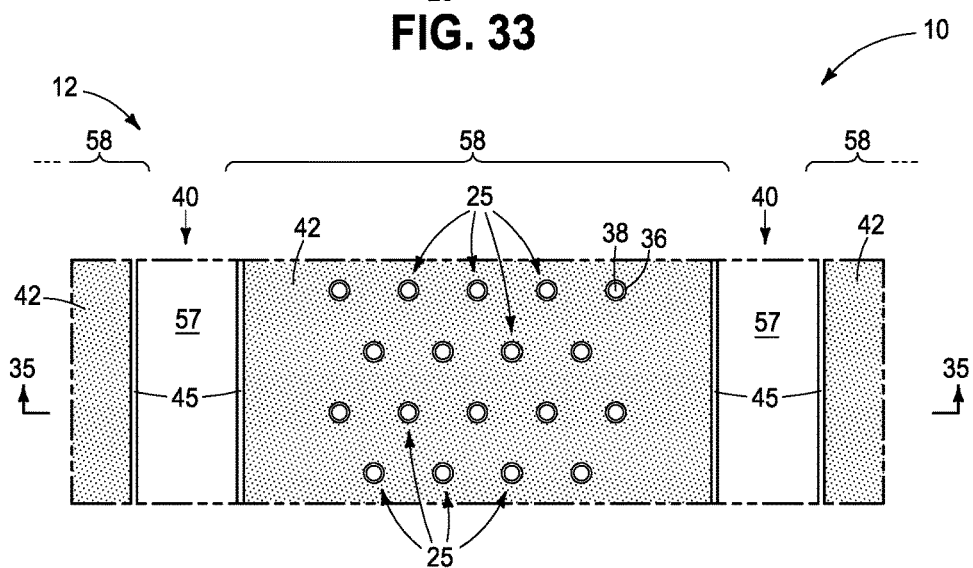

Referring to FIGS. 31 and 32, an optional selective oxidation has been conducted, thus forming an oxide layer 45 (e.g., silicon dioxide).

Referring to FIGS. 33-38, material 26 (not shown) of conductive tiers 22* has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22* in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 38 and some with dashed outlines in FIGS. 33, 35, and 37, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 38) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22* is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

In one embodiment and as shown, lowest surface 71 of channel material 36 of channel-material-string structures 53 is never directly against any of conductor material 17 of conductor tier 16.

Intervening material 57 has been formed in trenches 40 and void-spaces left as a result of the removing of second sacrificial material 15 of lines 13, and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (not shown). Some material in trenches 40 formed prior to forming that which is designated as intervening material 57 may remain and thereby comprise part of the intervening material 57. Regardless, in one embodiment at least a majority of intervening material 57 is formed in the trenches and void spaces after forming conductive material 42.

Any other attribute(s) or aspects) as shown and/or described herein with respect to other embodiments may be used in the embodiments shown and described with reference to the above embodiments.

Figure 39:
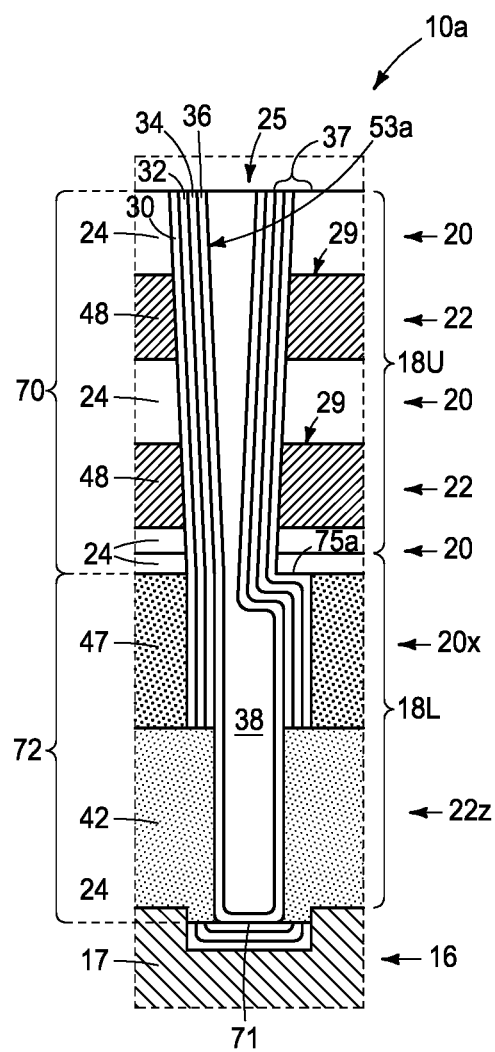

FIGS. 39, 40, and 41 show example resultant constructions 10a, 10b, and 10c, respectively, that may result from FIGS. 11, 12, and 13, respectively. Any other attribute(s) or aspect(s) as shown and/or described herein with respect to other embodiments may be used.

Figure 42:
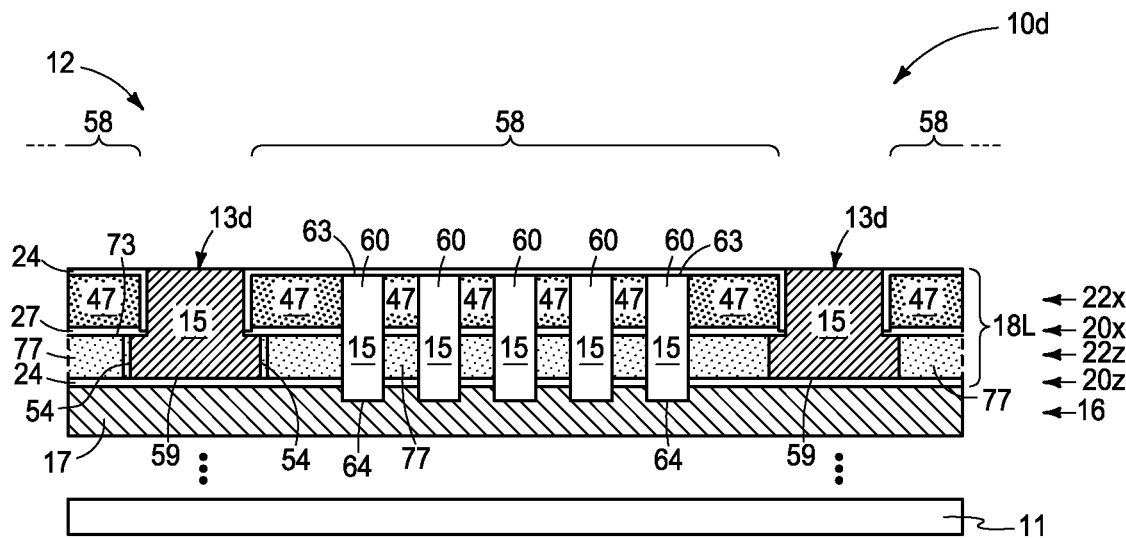
Figure 43:
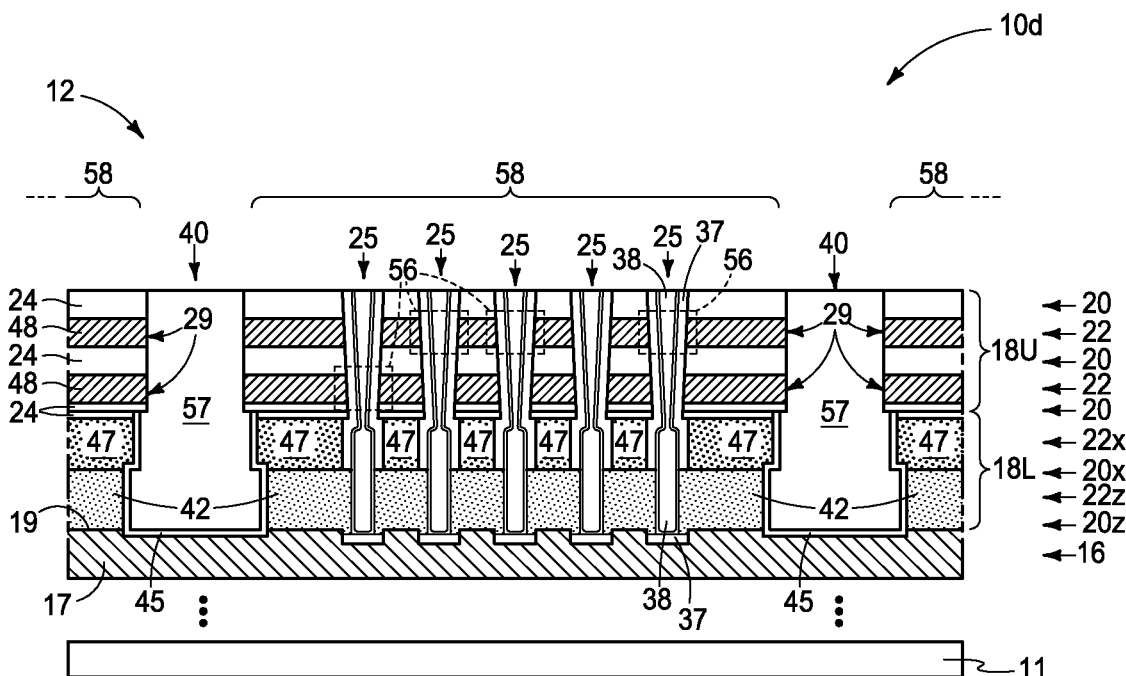

FIGS. 42 and 43 show an example alternate embodiment construction 10d in process in accordance with an embodiment of the invention. Like numerals from the above-described embodiments have been used where appropriate, with some construction differences being indicated with the suffix "d" or with different numerals. FIG. 42 corresponds in processing sequence to that of FIG. 2. Construction 10d has individual lines 13d that have a bottom surface 59 that is below a top 73 of lowest first tier 22z. Further, in one such embodiment and as shown, lines 13d individually comprise laterally-opposing projections 54 longitudinally-there-along that are in lowest first tier 22z. Analogous and/or alternate processing to that shown and described above may occur to result in a construction 10d as shown in FIG. 43 (which corresponds in sequence and view to that of FIG. 35 of the first-described embodiment). Any other attribute(s) or aspect(s) as shown and/or described herein with respect to other embodiments may be used.

Figure 44:
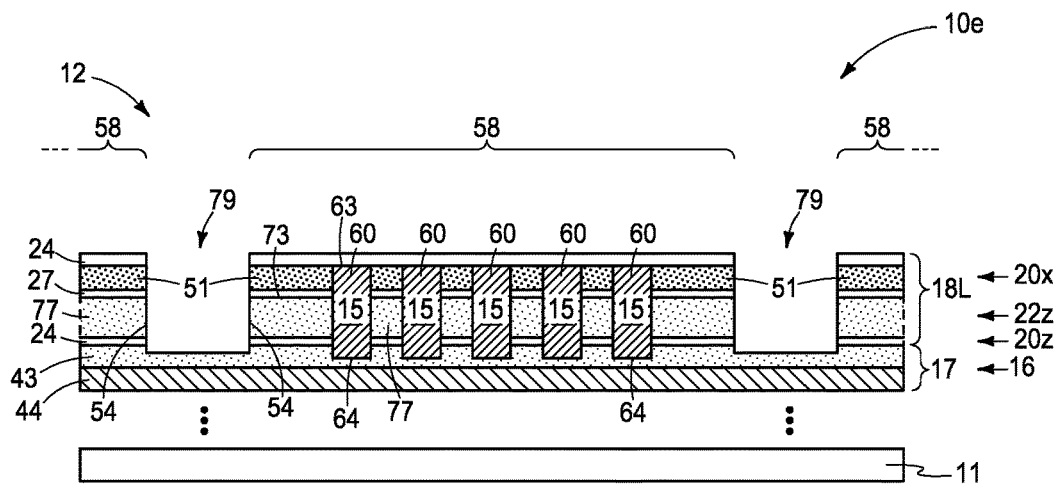

An alternate method is described with reference to FIGS. 44-48. Like numerals from the above-described embodiments have been used where appropriate, with some construction differences being indicated with the suffix "e" or with different numerals. FIG. 44 corresponds in processing sequence to that of FIG. 2. Example construction 10e has conductor material 17 of conductor tier 16 as comprising upper conductor material 43 (e.g., n-type or p-type conductively-doped polysilicon) directly above (e.g., directly against) lower conductor material 44 (e.g., WSi$_x$) of different composition from upper conductor material 43. Second tier 20x that is immediately-above lowest first tier 22z comprises undoped polysilicon 51 (as well as second tier materials/layers 27 and 24). A silicon nitride layer (not shown) may be between second material 27 and undoped polysilicon 51, and thereby be a part of insulative tier 20x. Horizontally-elongated troughs 79 have been formed in lower portion 18L and extend to conductor tier 16.

Figure 45:
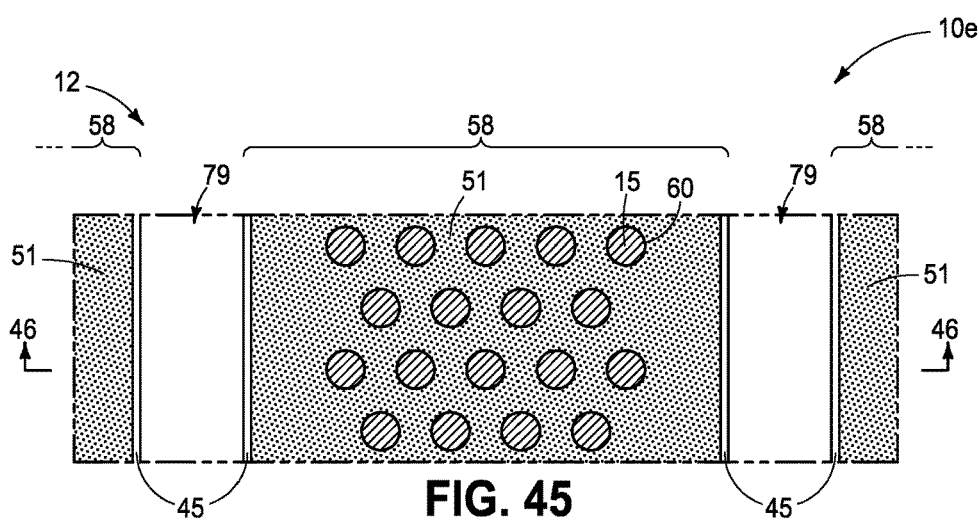
Figure 46:
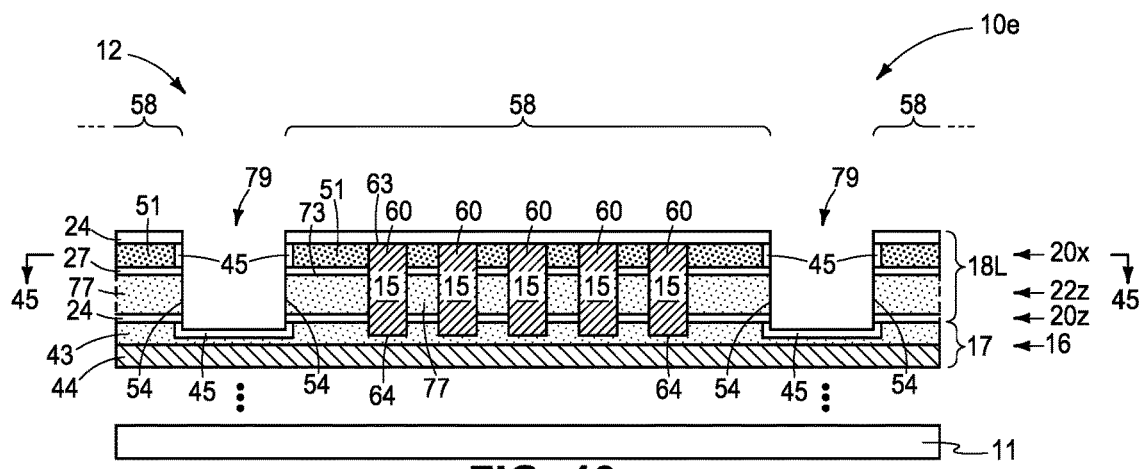

Referring to FIGS. 45 and 46, exposed portions of conductor material 43 of conductor tier 16 and undoped polysilicon 51 have been oxidized, thus forming insulative oxide 45 (e.g., silicon dioxide; e.g., longitudinally-along what will be lines 13e).

Figure 47:
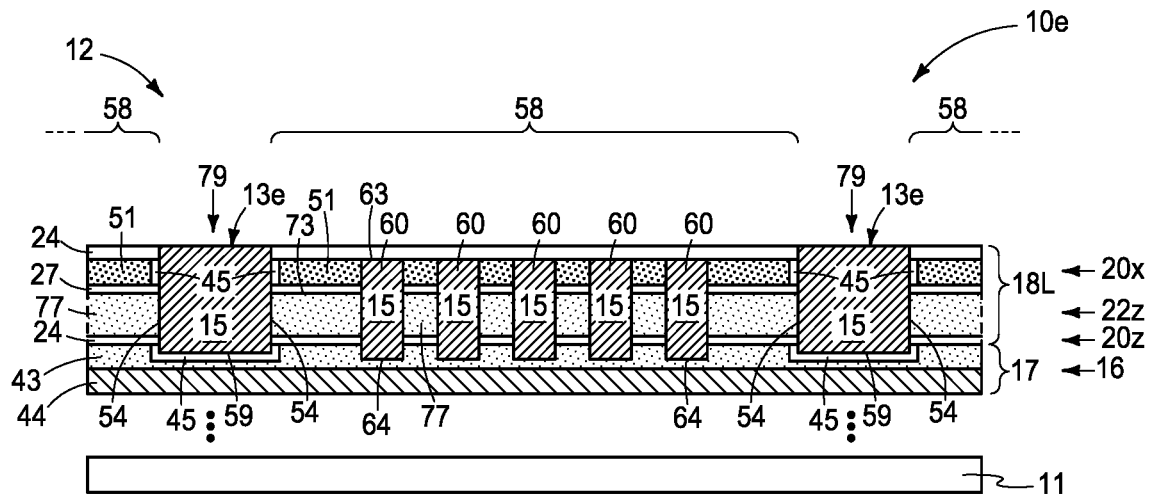

Thereafter, and referring to FIG. 47, horizontally-elongated lines 13e have been formed in troughs 79 and are individually between immediately-laterally-adjacent memory-block regions 58. Example lines 13e comprise second sacrificial material 15. In one embodiment, bottom surface 59 of individual lines 13e is in conductor tier 16 and in one such embodiment is not directly against the conductor material thereof (e.g., due to presence of insulating oxide 45).

Figure 35:
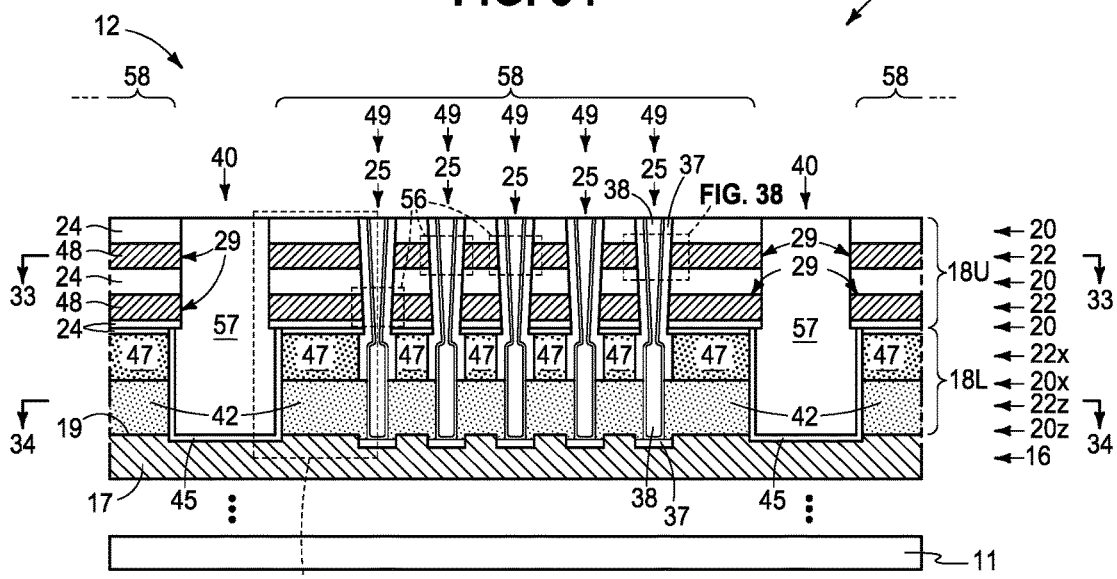
Figure 36:
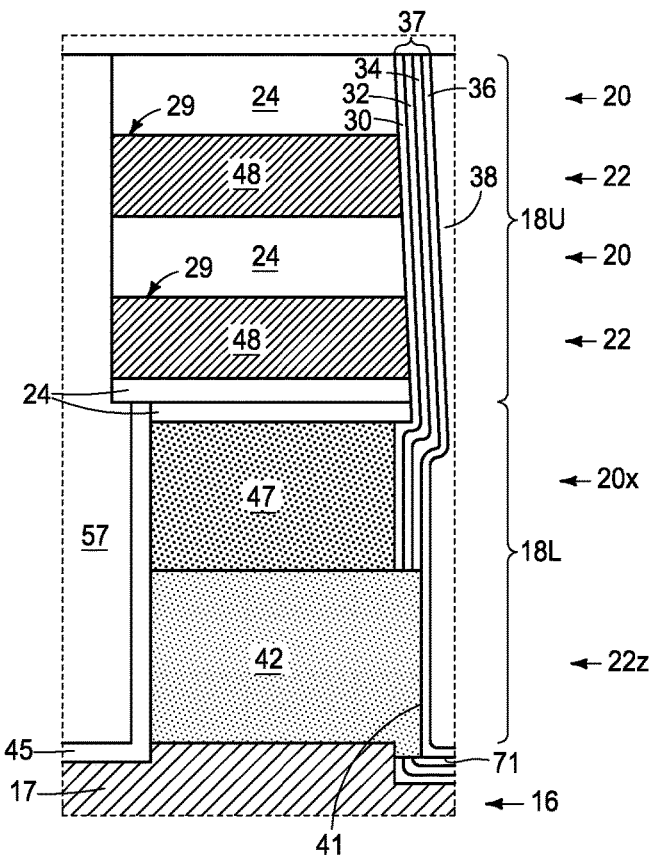
Figure 37:
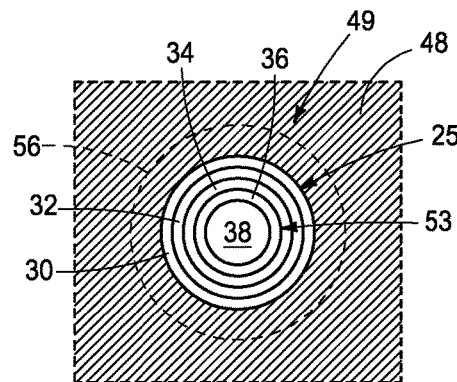
Figure 38:
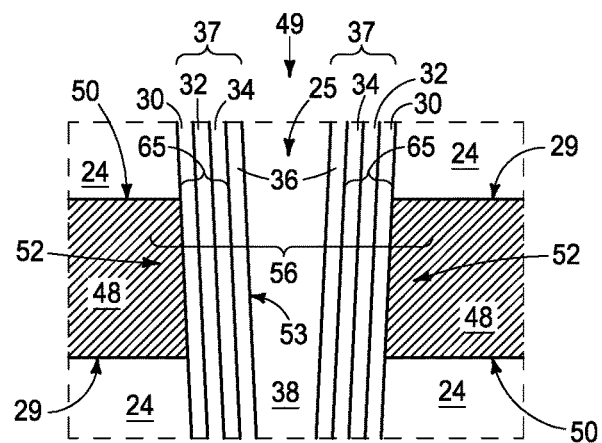
Figure 48:
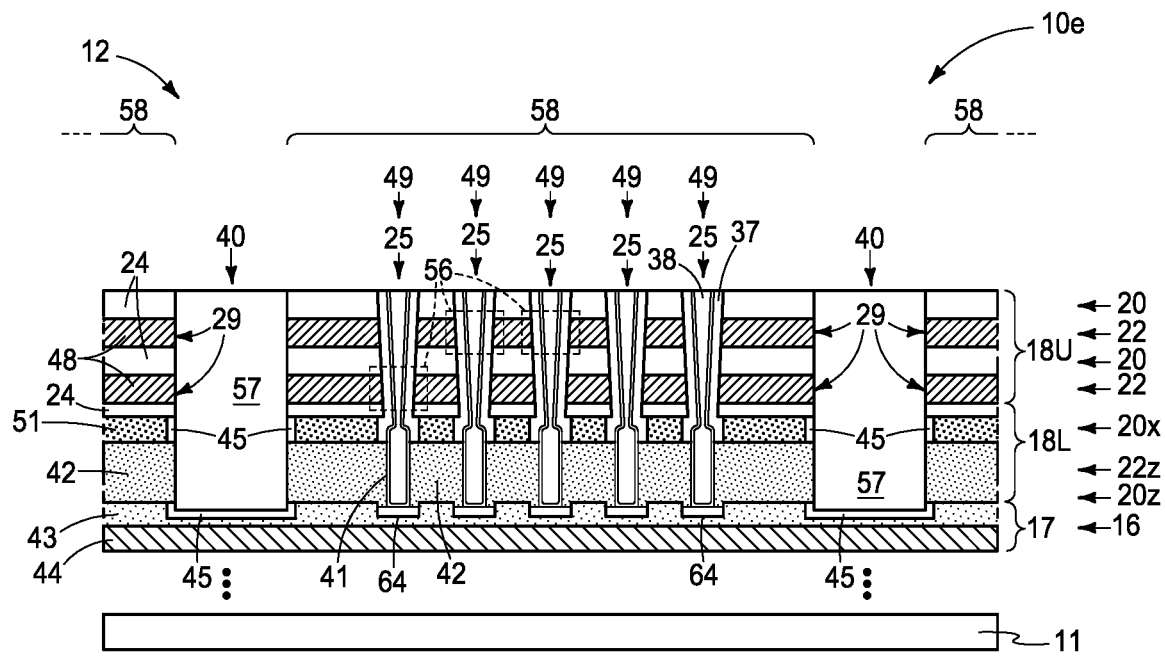

Analogous and/or alternate processing to that shown and described above may occur to result in a construction 10e as shown in FIG. 48 (which corresponds in sequence and view to that of FIG. 35 of the first-described embodiment). Any other attribute(s) or aspect(s) as shown and/or described herein with respect to other embodiments may be used.

Figure 49:
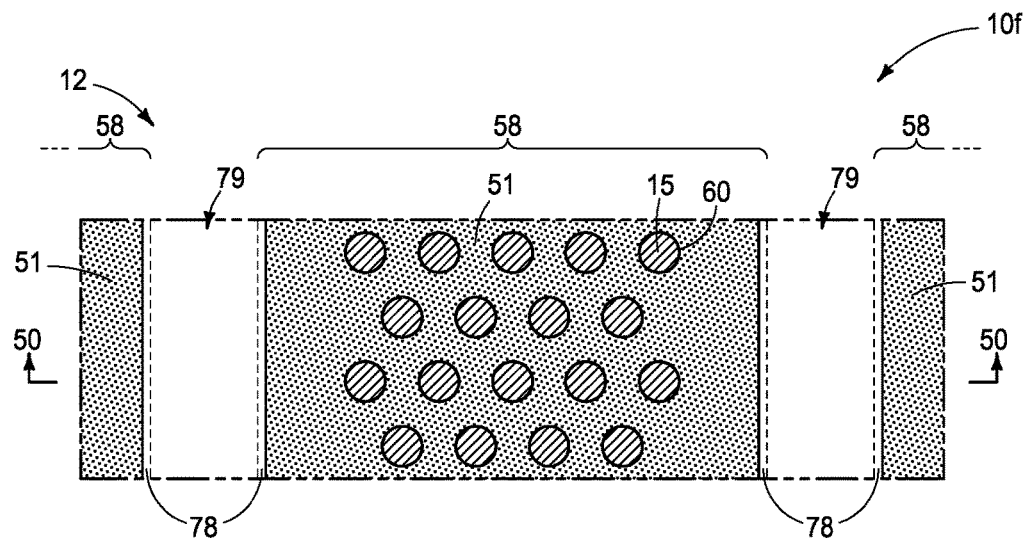
Figure 50:
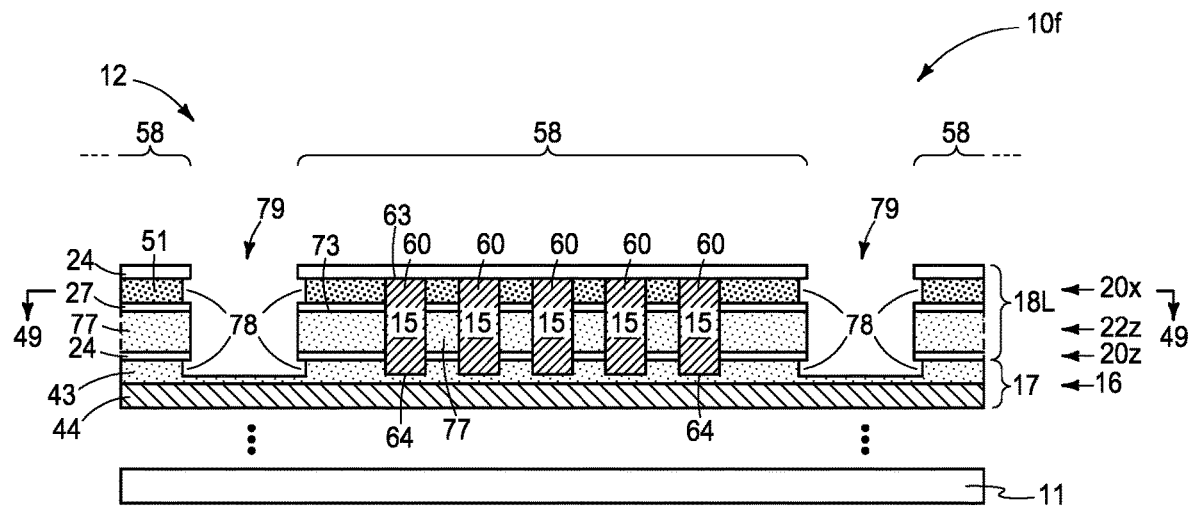

An alternate method to that of shown and described with reference to FIGS. 44-48 is described with reference to FIGS. 49-53. Like numerals from the above-described embodiments have been used where appropriate, with some construction differences being indicated with the suffix "f" or with different numerals. FIGS. 49 and 50 corresponds in processing sequence to that of FIGS. 44 and 46, collectively. Undoped polysilicon 51 has been laterally recessed (e.g., by isotropic etching) to form laterally-opposed recesses 78 longitudinally-along individual troughs 79. In one embodiment, laterally-opposed recesses 78 have also been formed in conductor material 17 as shown.

Figure 51:
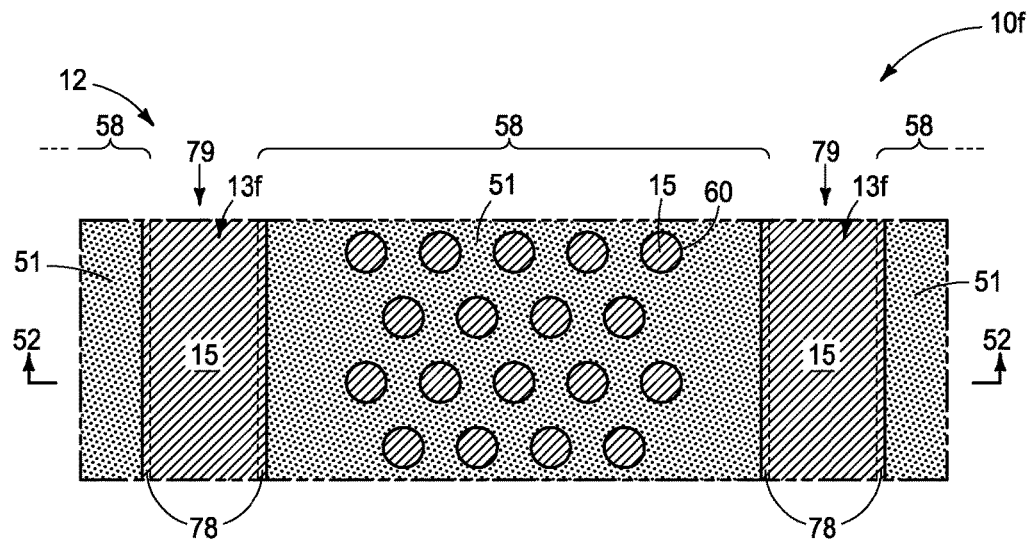
Figure 52:
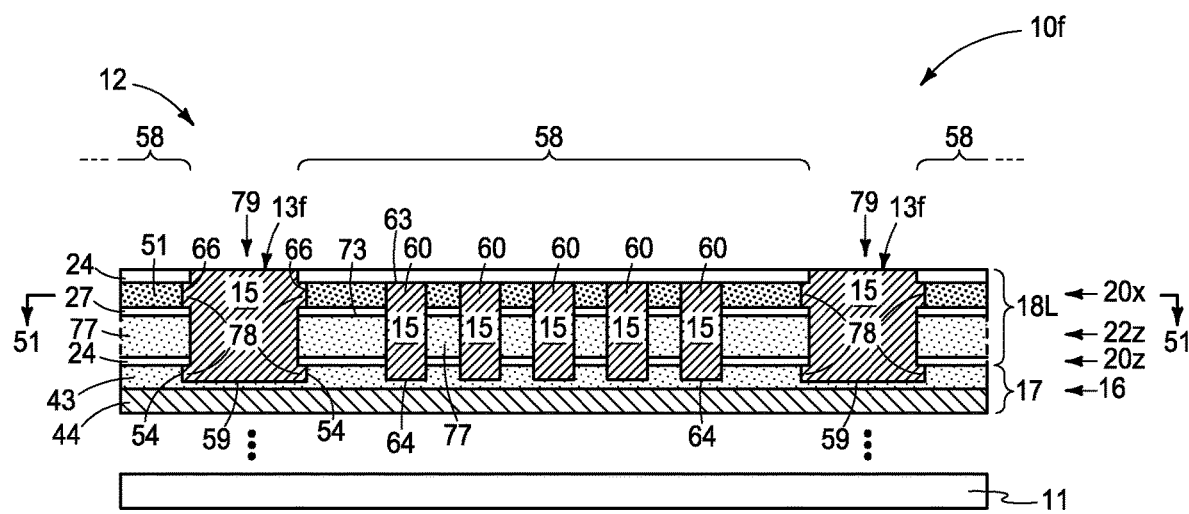

Referring to FIGS. 51 and 52, horizontally-elongated lines 13f (comprising second sacrificial material 15) have been formed in troughs 79 and are individually between immediately-laterally-adjacent memory-block regions 58. Lines 13f individually comprise laterally-opposing projections 66 longitudinally-there-along that are in laterally-opposed recesses 78. In one embodiment, lines 13f comprise bottom surfaces 59 that are in conductor tier 16. In one embodiment where laterally-opposed recesses 78 have also been formed in conductor material 43, lines 13f also individually comprise laterally-opposing projections 54 longitudinally-there-along that are in laterally-opposed recesses 78 in conductor material 43.

Figure 53:
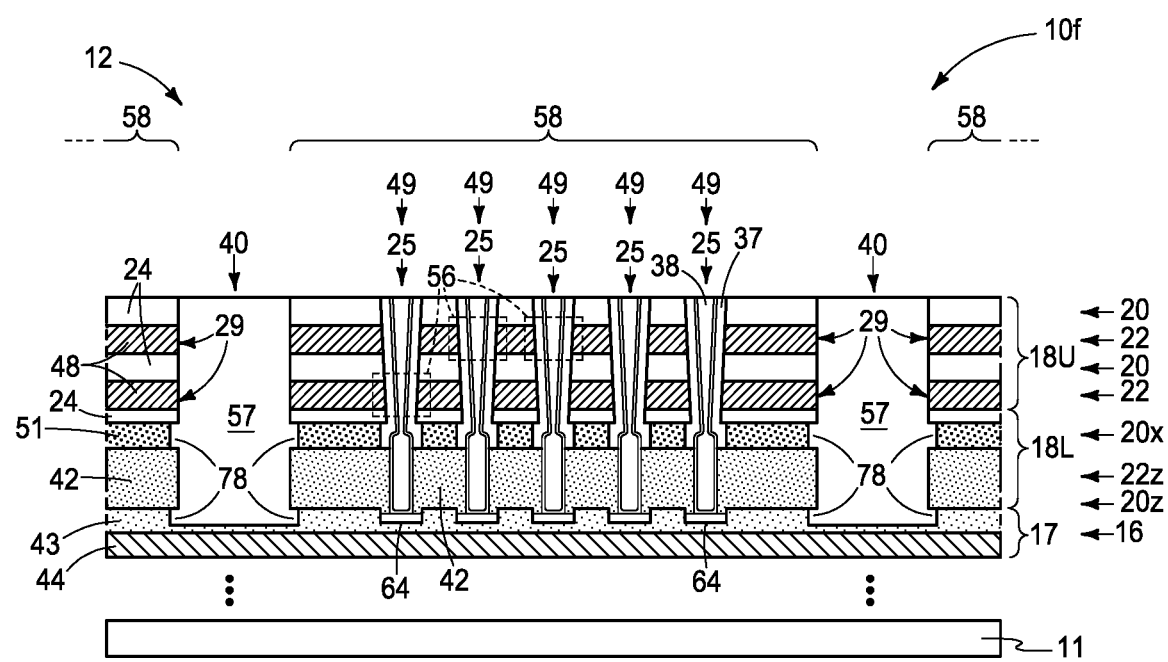

Analogous and/or alternate processing to that shown and described above may occur to result in a construction 10f as shown in FIG. 53 (which corresponds in sequence and view to that of FIG. 35 of the first-described embodiment). Any other attribute(s) or aspect(s) as shown and/or described herein with respect to other embodiments may be used.

In some embodiments, a method used in forming a memory array (e.g., 12) comprising strings (e.g., 49) of memory cells (e.g., 56) comprises forming a lower portion (e.g., 18L) of a stack (e.g., 18\*) that will comprise vertically-alternating first tiers (e.g., 22\*) and second tiers (e.g., 20\*). The stack comprises laterally-spaced memory-block regions (e.g., 58). Material of the first tiers is of different composition from material of the second tiers. Pillars (e.g., 60) are formed in the lower portion and are individually horizontally-located where individual channel-material-string structures (e.g., 53) will be formed. The pillars comprising sacrificial material (e.g., 15). Vertically-alternating first tiers and second tiers of an upper portion (e.g., 18I) of the stack is formed above the lower portion and the pillars. Channel openings (e.g., 25) are formed into the stack and individually extend to individual of the pillars. The sacrificial material of the pillars is removed through the channel openings to extend the channel openings deeper into the stack. Channel-material-string structures are formed in the extended channel openings and in void-space therein resulting from the removing of the pillars. Any other attributes) or aspect(s) as shown and/or described herein with respect to other embodiments may be used.

In some embodiments, a method used in forming a memory array (e.g., 12) comprising strings (e.g., 49) of memory cells (e.g., 56) comprises forming a conductor tier (e.g., 16) comprising conductor material (e.g., 17) on a substrate (e.g., 11). A lower portion (e.g., 18L) of a stack (e.g., 18\*) that will comprise vertically-alternating first tiers (e.g., 22\*) and second tiers (e.g., 20\*) is formed above the conductor tier. The stack comprising laterally-spaced memory-block regions (e.g., 58). Material of the first tiers is of different composition from material of the second tiers. A lowest of the first tiers (e.g., 22z) comprises first sacrificial material (e.g., 77). Pillars (e.g., 60) are formed in the lowest first tier and are individually horizontally-located where individual channel-material-string structures (e.g., 53) will be formed. The pillars comprise second sacrificial material (e.g., 15). Vertically-alternating first tiers and second tiers of an upper portion (e.g., 18U of the stack ae formed above the lower portion and the pillars. Channel openings (e.g., 25) are formed into the stack and individually extend to individual of the pillars. The second sacrificial material of the pillars is removed through the channel openings to extend the channel openings deeper into the stack. Channel-material-string structures are formed in the extended channel openings and in void-space therein resulting from the removing of the pillars. Horizontally-elongated trenches (e.g., 40) are formed into the stack and are individually between immediately-laterally-adjacent of the memory-block regions and extend to the first sacrificial material in the lowest first tier. The first sacrificial material is isotropically etched from the lowest first tier through the trenches. After the isotropically etching, conductive material (e.g., 42) is formed in the lowest first tier that directly electrically couples together the channel material of the individual channel-material-string structures and the conductor material of the conductor tier.

Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises a conductor tier (e.g., 16) comprising conductor material (e.g., 17). The memory array comprises laterally-spaced memory blocks (e.g., 58) individually comprising a vertical stack (e.g., 18*) comprising alternating insulative tiers (e.g., 20*) and conductive tiers (e.g., 22*). Channel-material-string structures (e.g., 53) of memory cells extend through the insulative tiers and the conductive tiers. The channel-material-string structures individually comprise an upper portion (e.g., 70) above and joined with a lower portion (e.g., 72). Individual of the channel-material-string structures comprising at least one external jog surface (e.g., 75, 75a, 75b, 75c) in a vertical cross-section where the upper and lower portions join. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, a method used in forming a memory array comprising strings of memory cells comprises forming a lower portion of a stack that will comprise vertically-alternating first tiers and second tiers on a substrate. The stack comprises laterally-spaced memory-block regions. Material of the first tiers is of different composition from material of the second tiers. Pillars are formed in the lower portion that are individually horizontally-located where individual channel-material-string structures will be formed. The pillars comprise sacrificial material. The vertically-alternating first tiers and second tiers of an upper portion of the stack are formed above the lower portion and the pillars. Channel openings are formed into the stack that individually extend to individual of the pillars. The sacrificial material of the pillars is removed through the channel openings to extend the channel openings deeper into the stack. Channel-material-string structures are formed in the extended channel openings and in void-space therein resulting from said removing.

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. Material of the first tiers is of different composition from material of the second tiers. A lowest of the first tiers comprises first sacrificial material. Pillars are formed in the lowest first tier that are individually horizontally-located where individual channel-material-string structures will be formed. The pillars comprise second sacrificial material. The vertically-alternating first tiers and second tiers of an upper portion of the stack are formed above the lower portion and the pillars. Channel openings are formed into the stack that individually extend to individual of the pillars. The second sacrificial material of the pillars is removed through the channel openings to extend the channel openings deeper into the stack. Channel-material-string structures are formed in the extended channel openings and in void-space therein resulting from said removing. Horizontally-elongated trenches are formed into the stack that are individually between immediately-laterally-adjacent of the memory-block regions and extend to the first sacrificial material in the lowest first tier. The first sacrificial material is isotropically etched from the lowest first tier through the trenches. After the isotropic etching, conductive material is formed in the lowest first tier that directly electrically couples together the channel material of the individual channel-material-string structures and the conductor material of the conductor tier.

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. Material of the first tiers is of different composition from material of the second tiers. A lowest of the first tiers comprises first sacrificial material. A next-lowest of the first tiers comprises conductively-doped polysilicon. Horizontally-elongated lines are formed in the next-lowest first tier that are individually between immediately-laterally-adjacent of the memory-block regions. The lines comprise second sacrificial material of different composition from the first-tier material that is or will be formed above the first sacrificial material, from the second-tier material that is or will be formed above the first sacrificial material, and from material of the next-lowest first tier. The vertically-alternating first tiers and second tiers of an upper portion of the stack are formed above the lower portion and the lines. Channel-material-string structures are formed that extend through the first tiers and the second tiers in the upper portion to the lowest first tier in the lower portion. Horizontally-elongated trenches are formed into the stack that are individually between the immediately-laterally-adjacent memory-block regions and extend to the line there-between. The second sacrificial material of the lines is removed through the trenches. Intervening material is formed in the trenches and void-spaces left as a result of the removing of the second sacrificial material of the lines.

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. Material of the first tiers is of different composition from material of the second tiers. A lowest of the first tiers comprises first sacrificial material. The second-tier material of the second tier that is immediately-above the lowest first tier comprises undoped polysilicon. Horizontally-elongated troughs are formed in the lowest portion that extend to the conductor tier. Exposed portions of the conductor material of the conductor tier and of the undoped polysilicon are oxidized. After the oxidizing, horizontally-elongated lines are formed in the troughs that are individually between immediately-laterally-adjacent of the memory-block regions. The lines comprise second sacrificial material. The vertically-alternating first tiers and second tiers of an upper portion of the stack are formed above the lower portion and the lines. Channel-material-string structures are formed that extend through first tiers and the second tiers in the upper portion to the lowest first tier in the lower portion. Horizontally-elongated trenches are formed into the stack that are individually between the immediately-laterally-adjacent memory-block regions and extend to the line there-between. The second sacrificial material of the lines is removed through the trenches. Intervening material is formed in the trenches and void-spaces left as a result of the removing of the second sacrificial material of the lines.

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. Material of the first tiers is of different composition from material of the second tiers. A lowest of the first tiers comprises first sacrificial material. The second-tier material of the second tier that is immediately-above the lowest first tier comprises undoped polysilicon. Horizontally-elongated troughs are formed in the lowest portion that extend to the conductor tier. The undoped polysilicon is laterally recessed to form laterally-opposed recesses longitudinally-along individual of the troughs. After the recessing, horizontally-elongated lines are formed in the troughs that are individually between immediately-laterally-adjacent of the memory-block regions. The lines individually comprise laterally-opposing projections longitudinally-there-along that are in the laterally-opposed recesses. The lines comprise second sacrificial material. The vertically-alternating first tiers and second tiers of an upper portion of the stack are formed above the lower portion and the lines. Channel-material-string structures are formed that extend through first tiers and the second tiers in the upper portion to the lowest first tier in the lower portion. Horizontally-elongated trenches are formed into the stack that are individually between the immediately-laterally-adjacent memory-block regions and extend to the line there-between. The second sacrificial material of the lines is removed through the trenches. Intervening material is formed in the trenches and void-spaces left as a result of the removing of the second sacrificial material of the lines.

In some embodiments, a memory array comprising strings of memory cells comprises laterally-spaced memory blocks individually comprising a vertical stack comprising alternating insulative tiers and conductive tiers. Channel-material-string structures of memory cells extend through the insulative tiers and the conductive tiers. The channel-material-string structures individually comprise an upper portion above and joined with a lower portion. Individual of the channel-material-string structures comprises at least one external jog surface in a vertical cross-section where the upper and lower portions join.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising strings of memory cells, comprising:
   laterally-spaced memory blocks individually comprising a vertical stack comprising alternating insulative tiers and conductive tiers above a conductor tier, channel-material-string structures of memory cells extending through the insulative tiers and the conductive tiers channel material of the channel-material-string structures directly electrically coupling with conductor material of the conductor tier; and
   the channel-material-string structures individually comprising an upper portion above and joined with a lower portion between the lowest and the next lowest of the conductive tiers, individual of the channel-material-string structures comprising two and only two external jog surfaces between the lowest and the next lowest of the conductive tiers in a vertical cross-section where the upper and lower portions join, one of the two external jog surfaces being horizontal, the other of the two external jog surfaces not being horizontal.

2. The memory array of claim 1 wherein the individual channel-material-string structures have external sidewall surfaces that are straight through multiple of the insulative tiers and multiple of the conductive tiers in the vertical cross-section above the two external jog surfaces.

3. A memory array comprising strings of memory cells, comprising:
   laterally-spaced memory blocks individually comprising a vertical stack comprising alternating insulative tiers and conductive tiers above a conductor tier, channel-material-string structures of memory cells extending through the insulative tiers and the conductive tiers, channel material of the channel-material-string structures directly electrically coupling with conductor material of the conductor tier; and
   the channel-material-string structures individually comprising an upper portion above and joined with a lower portion between the lowest and the next lowest of the conductive tiers, individual of the channel-material-string structures comprising two external jog surfaces between the lowest and the next lowest of the conductive tiers in a vertical cross-section where the upper and lower portions join, laterally opposing regions of the channel material in the individual channel-material-string structures in the vertical cross-section being closest to one another below each of the two external jog surfaces and between the lowest and the next lowest of the conductive tiers than anywhere above the two external jog surfaces.

4. The memory array of claim 3 wherein the two jog surfaces are angled differently from vertical relative one another.

5. The memory array of claim 4 wherein one of the two jog surfaces is horizontal and the other of the two jog surfaces is not horizontal.

6. The memory array of claim 3 wherein the two jog surfaces are angled from vertical the same relative one another.

7. The memory array of claim 6 wherein the two jog surfaces are horizontal.

8. The memory array of claim 6 wherein neither of the two jog surfaces is horizontal.

9. A memory array comprising strings of memory cells, comprising:
   laterally-spaced memory blocks individually comprising a vertical stack comprising alternating insulative tiers and conductive tiers above a conductor tier, channel-material-string structures of memory cells extending through the insulative tiers and the conductive tiers, channel material of the channel-material-string structures directly electrically coupling with conductor material of the conductor tier; and
   the channel-material-string structures individually comprising an upper portion above and joined with a lower portion between the lowest and the next lowest of the conductive tiers, individual of the channel-material-string structures comprising one and only one external jog surface between the lowest and the next lowest of the conductive tiers in a vertical cross-section where the upper and lower portions join.

10. The memory array of claim 9 wherein the at least one jog surface is horizontal or within 10° of horizontal.

11. The memory array of claim 10 wherein the at least one jog surface is horizontal.

* * * * *